(12) United States Patent
Yahya

(10) Patent No.: US 10,709,071 B2
(45) Date of Patent: Jul. 14, 2020

(54) LUMINOUS FLUX CONTROL MEMBER, LIGHT-EMITTING DEVICE, AND ILLUMINATION APPARATUS

(71) Applicant: Enplas Corporation, Saitama (JP)

(72) Inventor: Maryam Husna Yahya, Tokyo (JP)

(73) Assignee: ENPLAS CORPORATION, Saitama (JP)

( * ) Notice: Subject to any disclaimer, the term of this patent is extended or adjusted under 35 U.S.C. 154(b) by 0 days.

(21) Appl. No.: 16/323,283

(22) PCT Filed: Jun. 8, 2017

(86) PCT No.: PCT/JP2017/021255
§ 371 (c)(1),
(2) Date: Feb. 5, 2019

(87) PCT Pub. No.: WO2018/025496
PCT Pub. Date: Feb. 8, 2018

(65) Prior Publication Data
US 2019/0200537 A1 Jul. 4, 2019

(30) Foreign Application Priority Data
Aug. 5, 2016 (JP) ................................. 2016-154891

(51) Int. Cl.
A01G 7/04 (2006.01)
F21V 5/00 (2018.01)
(Continued)

(52) U.S. Cl.
CPC .............. A01G 7/045 (2013.01); A01G 7/00 (2013.01); F21V 5/00 (2013.01); F21V 5/02 (2013.01);
(Continued)

(58) Field of Classification Search
CPC ................................ A61G 7/045; F21V 5/045
See application file for complete search history.

(56) References Cited

U.S. PATENT DOCUMENTS

2015/0016119 A1   1/2015 Inada et al.

FOREIGN PATENT DOCUMENTS

EP      2587129 A2    5/2013
JP   2008-153154 A    7/2008
(Continued)

OTHER PUBLICATIONS

International Search Report from International Application No. PCT/JP2017/021255 dated Aug. 15, 2017.
(Continued)

Primary Examiner — Sean P Gramling
(74) Attorney, Agent, or Firm — Brundidge & Stanger, P.C.

(57) ABSTRACT

An illumination apparatus (300) has: a surface (310) to be irradiated; and light-emitting devices (200) that are each obliquely arranged directly above the surface (310). The light-emitting devices (200) each have a light-emitting element (210) and a luminous flux control member (100). The luminous flux control member (100) distributes light emitted from the light-emitting element (210) in directions above and below the optical axis (OA) of the light-emitting element (210). The absolute value of the angle (θ1) formed between the optical axis (OA) and the optical axis of the light directed upward is smaller than the absolute value of the angle (θ2) formed between the optical axis (OA) and the optical axis of the light directed downward.

6 Claims, 15 Drawing Sheets

(51) Int. Cl.
*F21V 33/00* (2006.01)
*A01G 7/00* (2006.01)
*F21V 5/02* (2006.01)
*F21V 5/08* (2006.01)
*G02B 3/08* (2006.01)
*H01L 33/58* (2010.01)
*F21V 5/04* (2006.01)
*F21Y 115/10* (2016.01)
*A01G 18/00* (2018.01)

(52) U.S. Cl.
CPC ............... *F21V 5/045* (2013.01); *F21V 5/08* (2013.01); *F21V 33/00* (2013.01); *G02B 3/08* (2013.01); *H01L 33/58* (2013.01); *A01G 18/00* (2018.02); *F21Y 2115/10* (2016.08)

(56) References Cited

FOREIGN PATENT DOCUMENTS

| | | | | |
|---|---|---|---|---|
| JP | 2014-006488 A | | 1/2014 | |
| JP | 2014006488 A | * | 1/2014 | ............... F21V 5/08 |
| JP | 2015-018733 A | | 1/2015 | |
| JP | 2015-130838 A | | 7/2015 | |
| KR | 10-2015-0072602 A | | 6/2015 | |
| WO | 2013/179610 A1 | | 12/2013 | |

OTHER PUBLICATIONS

Extended European Search Report from EP Application No. 17836603.5 dated Feb. 21, 2020, 9 pages.

* cited by examiner

LUMINOUS FLUX CONTROL MEMBER, LIGHT-EMITTING DEVICE, AND ILLUMINATION APPARATUS

TECHNICAL FIELD

The present invention relates to a light flux controlling member, a light emitting device including the light flux controlling member, and an illumination apparatus including the light emitting device.

BACKGROUND ART

In recent years, from the viewpoint of energy conservation, light-emitting diodes (hereinafter, referred to as "LEDs") are used as light sources for illumination in place of fluorescent light, halogen lamps and the like. In addition, cultivation of plants and mushrooms by using artificial light is actively studied in recent years, and LEDs are used as the light sources of such artificial light. LEDs are more expensive than conventional light sources, and thus there is a demand for uniformly illuminating a larger region with less number of LEDs.

For using in a technique for uniformly illuminating a larger region with LEDs, known is a light flux controlling member which includes two incidence regions each having a plurality of projections formed thereon as illustrated in FIG. 12 and FIGS. 13A to 13E. The projection is composed of an inner inclining surface serving as an incidence surface, and an outer inclining surface serving as a total reflection surface. This light flux controlling member is capable of emitting light that is emitted from an LED, disposed at angle to a surface to be irradiated, toward a further position and more uniformly (see, for example, PTL 1).

As an illumination apparatus for cultivating plants which uses LEDs, an illumination apparatus that includes a plurality of light emitting devices is known, as illustrated in FIGS. 15A and 15B. The light emitting devices are disposed at a predetermined height from a surface to be irradiated and outside the surface to be irradiated in rows so that the light emitting devices face each other, and also disposed at angle to the surface to be irradiated (see, for example, PTL 2). In FIGS. 15A and 15B, reference signs 10, 20, 25, 30, 40 and 50 respectively indicate a cultivation shelf, a cultivation case, an opening of the cultivation case, a surface to be irradiated, a substrate and a light emitting device.

CITATION LIST

Patent Literature

PTL 1
Japanese Patent Application Laid-Open No. 2015-018733
PTL 2
Japanese Patent Application Laid-Open No. 2015-130838

SUMMARY OF INVENTION

Technical Problem

A light emitting device including a light flux controlling member and a light emitting element both disclosed in, for example, PTL 1 may be used as light emitting device 50 in the illumination apparatus. In the illumination apparatus, light emitting devices may be disposed outside a surface to be irradiated in the planar direction as illustrated in FIGS. 15A and 15B for uniformly illuminating a region, which is closer to the light emitting device, as well as other regions on the surface to be irradiated. Accordingly, the illumination apparatus may need some improvement in view of efficient use of the illumination apparatus itself or the space for cultivating plants, in which the illumination apparatus is used.

The first object of the present invention is to provide a light flux controlling member and a light emitting device capable of uniformly illuminating a surface to be irradiated with light from the vicinity of a light source to the further end from the light source when the surface to be irradiated is obliquely illuminated.

The second object of the present invention is to provide an illumination apparatus whose surface to be irradiated is uniformly illuminated from the vicinity of a light source to the further end from the light source.

Solution to Problem

The present invention provides as first means to achieve the first object the following: A light flux controlling member configured to control light distribution of light emitted from a light emitting element, the light flux controlling member comprising: an incidence region for allowing incidence of the light emitted from the light emitting element when the incidence region is disposed to face the light emitting element; and an emission region for emitting the light incident on the incidence region, the emission region being located on a side opposite to the light emitting element relative to the incidence region therebetween, wherein the incidence region includes: a first control portion which is located at least in one of two regions on a cross section of the light flux controlling member, the two regions being obtained by dividing the cross section by a reference axis included in the cross section, the reference axis being an axis to coincide with an optical axis of the light emitting element and to serve as an optical reference of the light flux controlling member, the one of the two regions being on a first side relative to the reference axis, the first control portion being configured to control the light emitted from the light emitting element and incident on the incidence region in such a way that the light is emitted from the emission region in a direction tilted toward the first side, and a second control portion which is located at least in the other one of the two regions on the cross section, the other one of the two regions being on a second side relative to the reference axis, the second control portion being configured to control the light emitted from the light emitting element and incident on the incidence region in such a way that the light is emitted from the emission region in a direction tilted toward the second side, wherein the second control portion includes a refraction incidence surface that allows the light emitted from the light emitting element to be refracted and incident on the light flux controlling member in such a way that an angle of the light relative to the reference axis becomes smaller, wherein a light distribution curve indicating luminous intensities on the cross section for emission directions of the light emitted from the emission region includes a first peak formed by first part of the light emitted from the emission region, the first part passing through the first control portion, and a second peak formed by second part of the light emitted from the emission region, the second part passing through the second control portion, and wherein an absolute value of angle θ1 of the first peak relative to the reference axis is smaller than that of angle θ2 of the second peak relative to the reference axis.

In addition, the present invention provides a light emitting device including the light flux controlling member and a light emitting element as second means to achieve the first object.

Further, the present invention provides as means to achieve the second object the following: An illumination apparatus comprising: a planar surface to be irradiated; and the above-described light emitting device, wherein the light emitting device is disposed directly upward from the surface to be irradiated in such a way that the optical axis obliquely intersects the surface to be irradiated, and the second control portion is positioned closer to the surface to be irradiated than the first control portion is.

Advantageous Effects of Invention

The light flux controlling member of the present invention is capable of uniformly illuminating a surface to be irradiated with light from the vicinity of a light source to the further end from the light source when illuminating the surface to be irradiated obliquely. Accordingly, the light emitting device of the present invention which includes the light flux controlling member and a light emitting element is also capable of uniformly illuminating a surface to be irradiated with light from the vicinity of a light source to the further end from the light source when illuminating the surface to be irradiated obliquely. Further, the illumination apparatus of the present invention having the light emitting device obliquely illuminating a surface to be irradiated is capable of uniformly illuminating the surface to be irradiated from the vicinity of a light source to the further end from the light source.

DESCRIPTION OF EMBODIMENT

Hereinafter, an embodiment of the present invention will be described in detail with reference to the accompanying drawings.

Figure 1A:
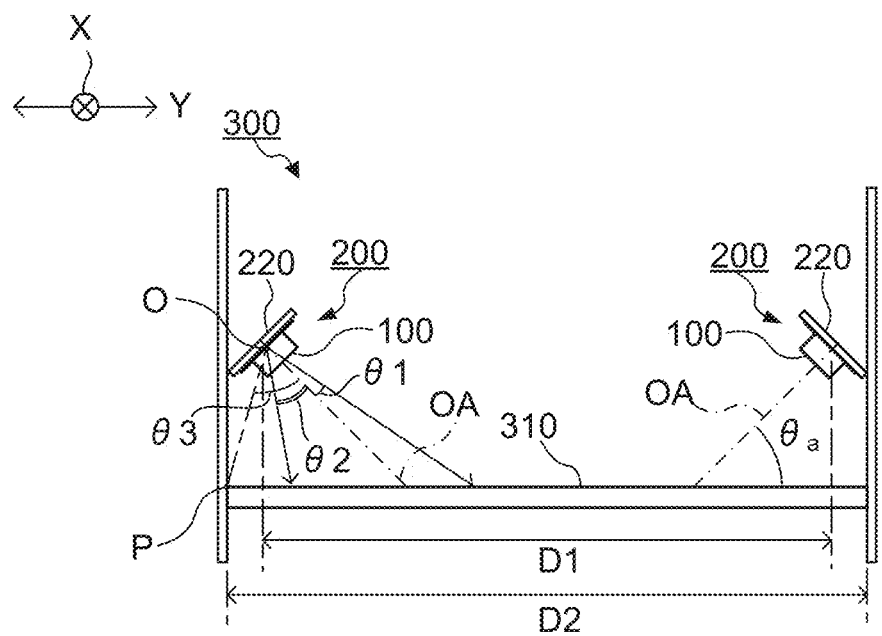
FIG. 1A is a front view schematically illustrating a configuration of a illumination apparatus according to an embodiment of the present invention.
Figure 1B:
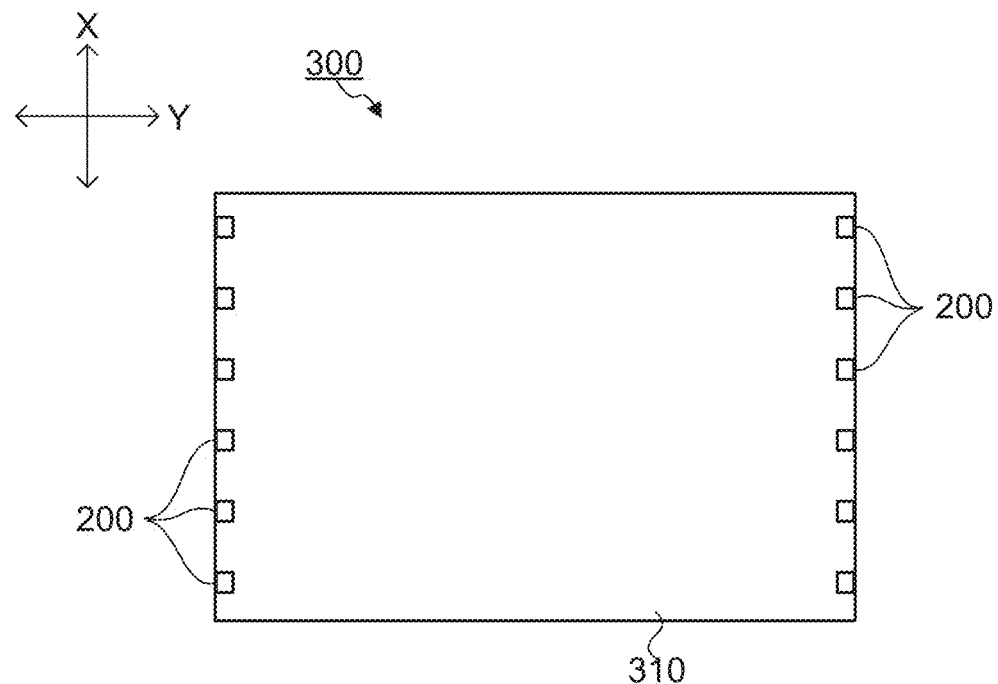
FIG. 1B is a plan view schematically illustrating the configuration of the illumination apparatus.

FIGS. 1A and 1B schematically illustrate a configuration of an illumination apparatus according to the present embodiment. FIG. 1A is a front view of illumination apparatus 300, and FIG. 1B is a plan view of illumination apparatus 300. As illustrated in FIGS. 1A and 1B, illumination apparatus 300 includes a plurality of light emitting devices 200 and planar surface to be irradiated 310. Light emitting device 200 includes light flux controlling member 100 and a light emitting element (not illustrated). FIGS. 1A and 1B are different in scale.

All light emitting devices 200 are disposed at a predetermined height from surface to be irradiated 310, and disposed directly upward from surface to be irradiated 310 in rows respectively extending along a pair of sides of surface to be irradiated 310. Specifically, light emitting device 200 is disposed in such a way that the lower edge of light emitting device 200 is at a position elevated directly upwards from the side of surface to be irradiated 310, and light emitting device 200 is tilted inward from the position. As light emitting device 200 is satisfactorily small compared to surface to be irradiated 310, light emitting device 200 is substantially disposed on the above described position.

In the row, six light emitting devices 200 are disposed, for example. Light emitting devices 200 are disposed at regular intervals in each row. A direction in which light emitting devices 200 are arrayed is defined as X-direction, a direction in which light emitting devices 200 face each other is defined as Y-direction, and the height direction from surface to be irradiated 310 is defined as Z-direction. The height of each light emitting device 200 from surface to be irradiated 310 is adjustable.

Each light emitting device 200 is disposed in such a way that a below-described second control portion is positioned close to surface to be irradiated 310 side compared to a below-described first control portion. In addition, each light emitting device 200 is disposed in an orientation such that optical axis OA of a light emitting element (reference sign 210 in FIG. 2) obliquely intersects surface to be irradiated 310. For example, light emitting device 200 is supported by substrate 220 in such a way that surface to be irradiated 310 and optical axis OA of the light emitting element (reference sign 210 in FIG. 2) intersect at angle θa (for example 40°). Angle θa at which surface to be irradiated 310 and optical axis OA intersect may be appropriately adjusted in a range of more than 0° to less than 90° so that high uniformity in illuminance of surface to be irradiated 310 can be obtained.

Figure 2:
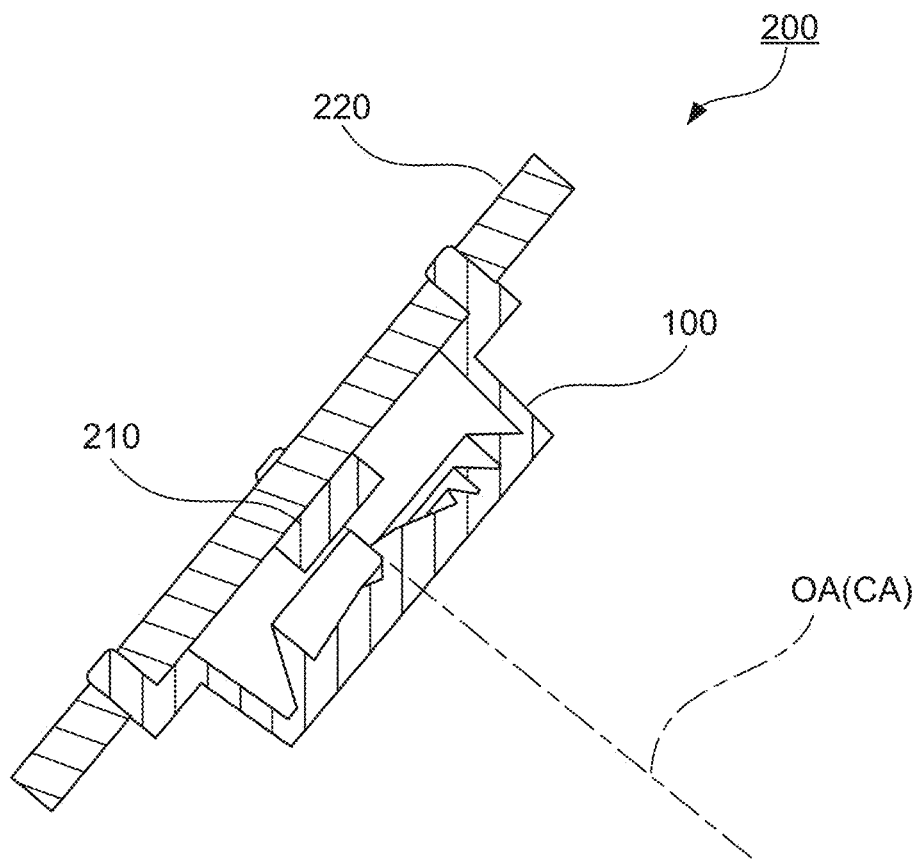
FIG. 2 is a cross-sectional view schematically illustrating a configuration of a light emitting device according to an embodiment of the present invention.

FIG. 2 is a cross-sectional view schematically illustrating a configuration of light emitting device 200. As illustrated in FIG. 2, light emitting device 200 includes light emitting element 210 disposed on substrate 220, and light flux controlling member 100 disposed above light emitting element 210 and on substrate 220. Light emitting element 210 is, for example, a light-emitting diode (LED) such as a white light-emitting diode. Light flux controlling member 100 controls light distribution of light emitted from light emitting element 210. Light flux controlling member 100 is disposed relative to light emitting element 210 in such a way that optical axis OA of light emitting element 210 coincides with central axis CA of light flux controlling member 100. Central axis CA is an axis serving as reference (reference axis) in a design of light flux controlling member 100 for giving a desired optical function to light flux controlling member 100 or for controlling the function.

Figure 3A:
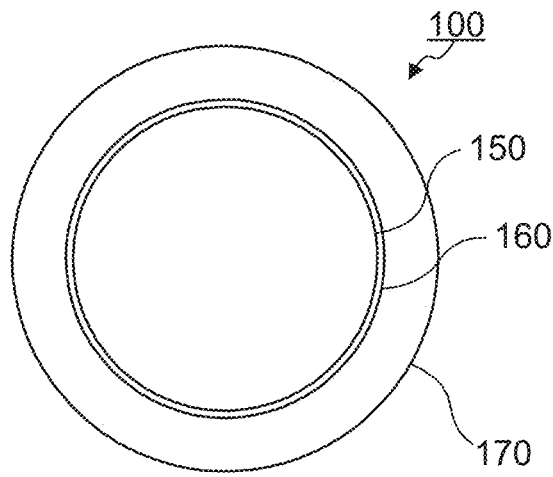
FIG. 3A is a plan view of a light flux controlling member according to an embodiment of the present invention.
Figure 3D:
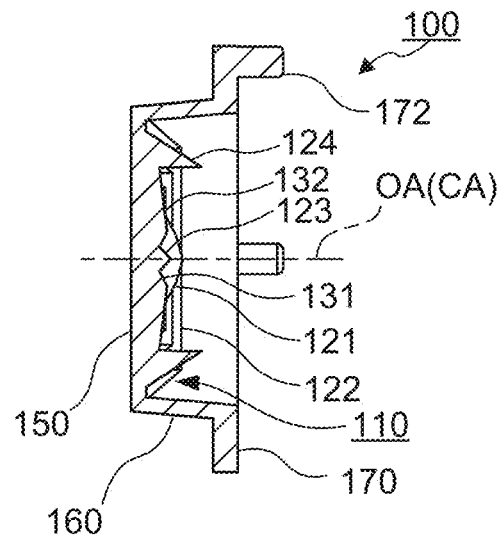
FIG. 3D illustrates a cross section of the light flux controlling member taken along line D-D of FIG. 3B.
Figure 3B:
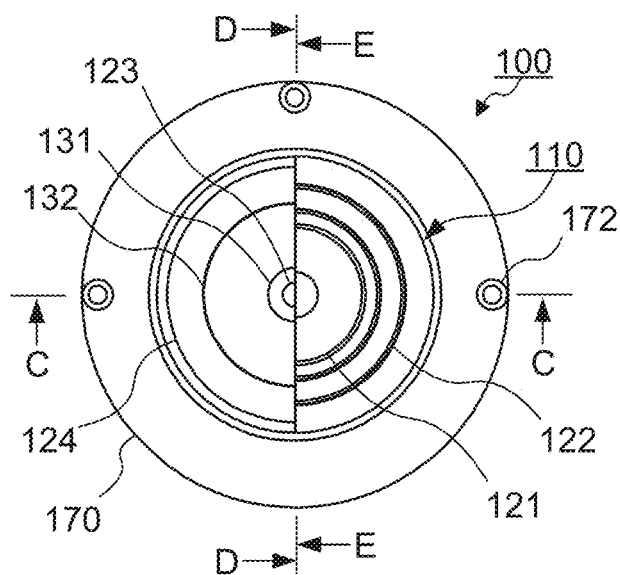
FIG. 3B is a bottom view of the light flux controlling member.
Figure 3E:
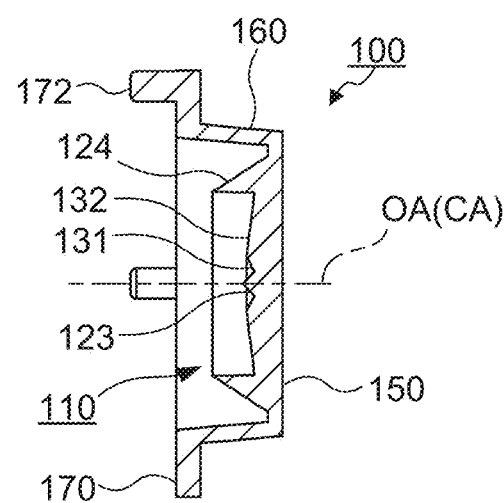
FIG. 3E illustrates a cross section of the light flux controlling member taken along line E-E of FIG. 3B.
Figure 3C:
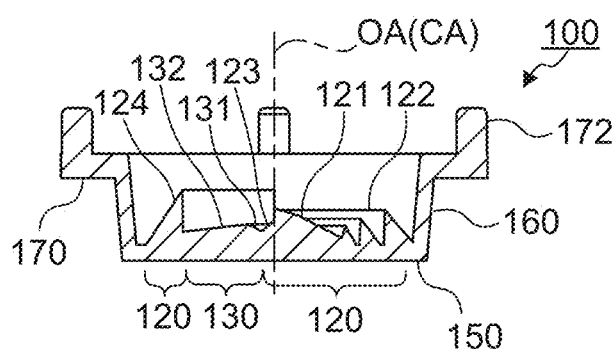
FIG. 3C illustrates a cross section of the light flux controlling member taken along line C-C of FIG. 3B.
Figure 4A:
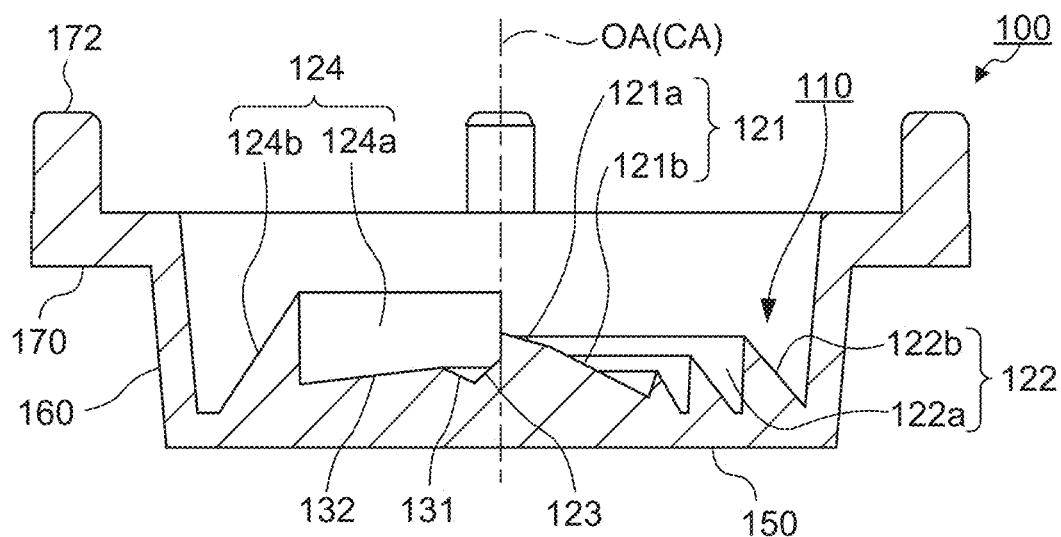
FIG. 4A illustrates an enlarged cross section of the light flux controlling member taken along line C-C of FIG. 3B.
Figure 4B:
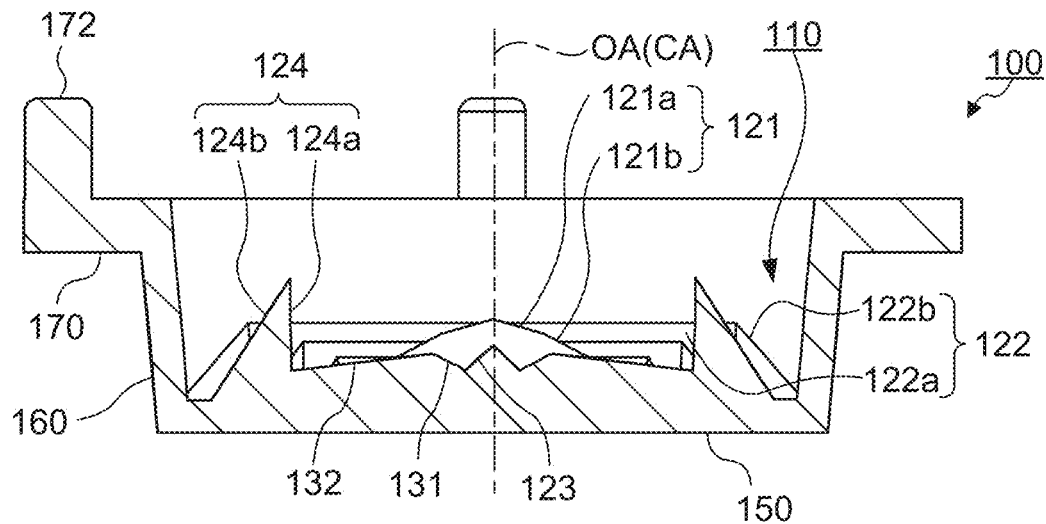
FIG. 4B illustrates an enlarged cross section of the light flux controlling member taken along line D-D of FIG. 3B.
Figure 4C:
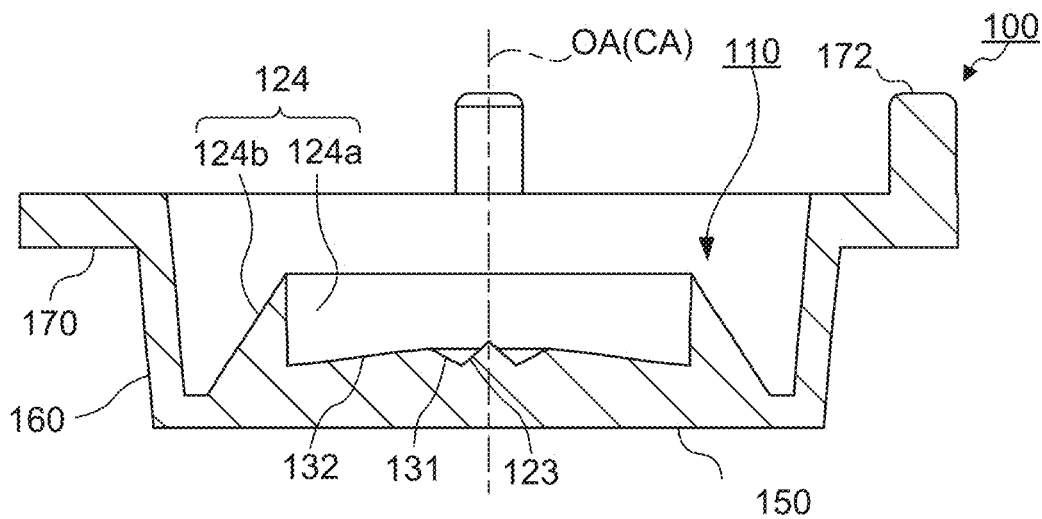
FIG. 4C illustrates an enlarged cross section of the light flux controlling member taken along line E-E of FIG. 3B.

FIGS. 3A to 3E and 4A to 4C schematically illustrate a configuration of light flux controlling member 100. FIG. 3A is a plan view of light flux controlling member 100 and FIG. 3B is a bottom view thereof. FIG. 3C is a cross-sectional view of light flux controlling member 100 taken along line C-C of FIG. 3B, FIG. 3D is a cross-sectional view of light flux controlling member 100 taken along line D-D of FIG. 3B, and FIG. 3E is a cross-sectional view of light flux controlling member 100 taken along line E-E of FIG. 3B. FIG. 4A illustrates an enlarged cross section of light flux controlling member 100 taken along line C-C of FIG. 3B, FIG. 4B illustrates an enlarged cross section of light flux controlling member 100 taken along line D-D of FIG. 3B, and FIG. 4C illustrates an enlarged cross section of light flux controlling member 100 taken along line E-E of FIG. 3B.

As illustrated in FIGS. 3A to 3E and 4A to 4C, light flux controlling member 100 has a shape of a bottomed cylinder (cup shaped). Light flux controlling member 100 includes incidence region 110 for allowing incidence of light emitted from light emitting element 210 when light flux controlling member 100 is disposed to face light emitting element 210, and emission region 150 for emitting the light incident on incidence region 110. Emission region 150 is located on a side opposite to light emitting element 210 relative to incidence region 110 therebetween. One surface (i.e., surface facing inside the cylinder) of a circular plate portion that corresponds to the bottom plate of the above-described cylinder is incidence region 110, and the other surface is emission region 150. Incidence region 110 and emission region 150 both have a circular shape in plan view.

Light flux controlling member 100 also includes tube portion 160 that corresponds to a peripheral wall of the above-described cylinder. Tube portion 160 has a substantially cylindrical shape. Tube portion 160 supports the above-described plate portion from incidence region 110 side, and positions incidence region 110 and emission region 150 relative to light emitting element 210.

Light flux controlling member 100 further includes flange 170 in a shape of an annular plate, and three bosses 172 protruding from flange 170. Flange 170 extends in the radial direction of the peripheral wall from the opening edge of tube portion 160. Boss 172 is a column protruding from a plane of flange 170 in a direction opposite to the direction toward tube portion 160. Bosses 172 are respectively disposed on three out of four portions which are obtained by cutting flange 170 into quarters in a circumferential direction.

Light flux controlling member 100 includes central axis CA. Central axis CA is a geometric central axis of light flux controlling member 100. Central axis CA passes through the center of a planar shape (circle) of incidence region 110, and also is the central axis of tube portion 160.

Light flux controlling member 100 is formed by integral molding. The material of light flux controlling member 100 may be appropriately selected from translucent or transparent materials that allow light of a desired wavelength to pass therethrough. Examples of the materials of light flux controlling member 100 include light transmissive resins, such as polymethylmethacrylate (PMMA), polycarbonate (PC), or epoxy resins (EP), and glass.

Incidence region 110 includes first control portion 120 and second control portion 130. First control portion 120 is a part for controlling light that is emitted from light emitting element 210 and incident on incidence region 110 (changing the traveling direction of the light) in such a way that the light is emitted from emission region 150 in a direction tilted toward one of two regions in incidence region 110 and on a cross section of light flux controlling member 100, which are obtained by dividing the cross section by optical axis OA (the cross section includes optical axis OA of light emitting element 210). The emitted light is controlled by refraction, total reflection or the like. First control portion 120 includes a part located in one (e.g., a region above optical axis OA in FIG. 2) of the above-described two regions on the cross section obtained by dividing the cross section by optical axis OA. More specifically, first control portion 120 includes first inclining surface 121, partial annular fresnel lens 122, inner groove wall 123, and partial annular protrusion 124.

First inclining surface 121 has a shape of a fan (semicircle) with optical axis OA as its center in plan view. In first inclining surface 121, the distance from light emitting element 210 in a direction along optical axis OA (central axis CA) increases as the distance from the center increases in a planar direction. First inclining surface 121 is composed of inner inclining surface 121*a* and outer inclining surface 121*b*. Inner inclining surface 121*a* is a part extending from the center and inclining at a smaller inclination angle.

Outer inclining surface 121*b* is a part connected with the external side of inner inclining surface 121*a* and inclining at a larger inclination angle. "Inclining at a smaller (larger) inclination angle" means the increasing rate of the distance from light emitting element 210 in the direction along optical axis OA (central axis CA) becomes smaller (larger) as the distance from the center increases in the planar direction.

Partial annular fresnel lens 122 is located outside and along the arc of first inclining surface 121. Partial annular fresnel lens 122 is composed of plurality of protrusions. Each protrusion includes an arc-shaped ridge line, and inner peripheral wall 122*a* on the center side and outer peripheral wall 122*b* on the opposite side with the ridge line therebetween. The protrusions are located in such a way that the ridge lines thereof are positioned concentrically. Outer peripheral wall 122*b* is configured as a total reflection surface. Accordingly, partial annular fresnel lens 122 constitutes a reflective fresnel lens portion.

Inner groove wall 123 is located closest to the center in a semicircle portion of incidence region 110 in plan view. The semicircle portion is the other semicircle that does not include first inclining surface 121 or partial annular fresnel lens 122. Inner groove wall 123 is an inner one of two facing groove walls in a V-shaped groove having an arc shape with optical axis OA as its center in plan view, that is, inner groove wall 123 is a groove wall portion on the center side. In other words, inner groove wall 123 is an inclining surface which has a semicircular shape in plan view and extends from optical axis OA to the bottom of the V-shaped groove. The top of inner groove wall 123 is positioned farther from light emitting element 210 in a direction along optical axis OA than the top of first inclining surface 121 is. The center of inner groove wall 123 is thus positioned lower (farther from light emitting element 210) than the center of first inclining surface 121 is.

Partial annular protrusion 124 is located in the outermost region of the above-described semicircle portion (i.e., the other semicircle). Partial annular protrusion 124 includes an arc-shaped ridge line, inside peripheral wall 124*a* on the center side, and outside peripheral wall 124*b* on the opposite side. Outside peripheral wall 124*b* is also configured as a total reflection surface in a similar manner as the total reflection surface of partial annular fresnel lens 122.

Second control portion 130 is a part for controlling light that is emitted from light emitting element 210 and incident on incidence region 110 (changing the traveling direction of the light) in such a way that the light is emitted from emission region 150 in a direction tilted toward the other one (e.g., a region below optical axis OA in FIG. 2) of the above-described two regions in incidence region 110 and on the cross section which are obtained by dividing the cross section by optical axis OA. This emitted light is also controlled by refraction, total reflection or the like. Second control portion 130 includes a part located in the other one (e.g., a region below optical axis OA in FIG. 2) of the above-described two regions obtained by dividing the cross section by optical axis OA on the cross section. More specifically, second control portion 130 includes outer groove wall 131 and second inclining surface 132.

Outer groove wall 131 is an outer one of the two facing groove walls in the V-shaped groove, that is, outer groove wall 131 is a groove wall portion on a side opposite to the center side.

Second inclining surface 132 is located to connect with the external side of outer groove wall 131. In second inclining surface 132, the distance from light emitting element 210 in a direction along optical axis OA increases as the distance from the center increases in a planar direction. Second inclining surface 132 has a shape in plan view such that a smaller fan, which is located close to the center and includes the outer rim part of outer groove wall 131, is cut out from a larger fan, which includes from central axis CA to second inclining surface 132.

The above-described partial annular protrusion 124 is located outside and along the outer arc of second inclining surface 132. For example, partial annular protrusion 124 is located to connect with the external side of second inclining surface 132.

On the flange, three bosses 172 are respectively disposed on first control portion 120 side, second control portion 130 side and the boundary between the two sides. By fitting bosses 172 and corresponding holes in substrate 220, light flux controlling member 100 is disposed in light emitting device 200 in such a way that second control portion 130 is positioned closer to surface to be irradiated 310 (lower side in FIG. 2) than first control portion 120 is.

Figure 5A:
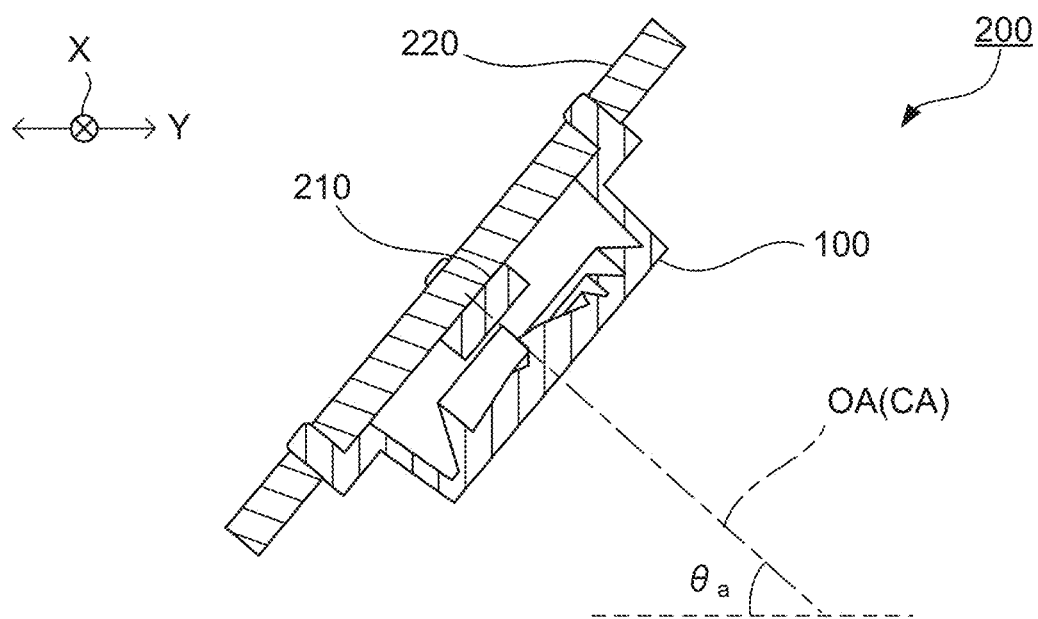
FIG. 5A is a diagram for showing the orientation of the light emitting device relative to a surface to be irradiated.
Figure 5B:
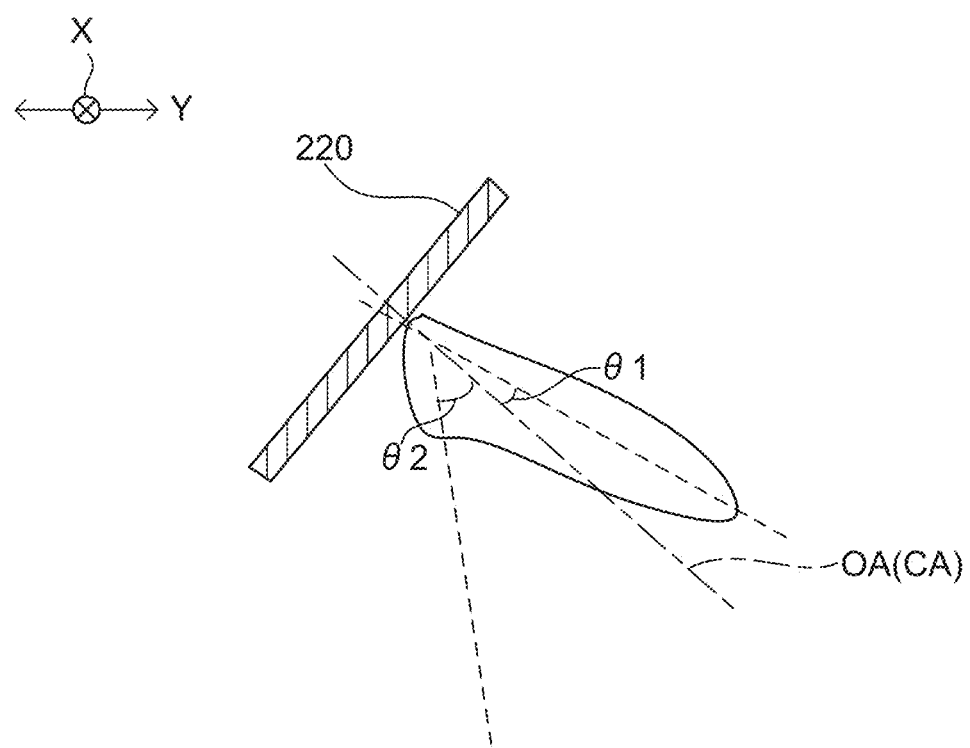
FIG. 5B is a graph showing an example of a light distribution curve of light emitted from the light emitting device.

FIG. 5A is a diagram for showing the orientation of light emitting device 200 relative to a surface to be irradiated. FIG. 5B is an image showing in relative intensity an example of a light distribution curve of light emitted from light emitting device 200 disposed in the orientation as illustrated in FIG. 5A. Light emitted from light emitting element 210 is incident on incidence region 110 and emitted from emission region 150 in a predetermined direction after the alignment of the light is controlled. In FIGS. 5A and 5B, a dash-dotted line represents optical axis OA of light emitting element 210. As described above, θa represents an angle between optical axis OA (central axis CA) and the surface to be irradiated in FIG. 5A. Angle θa is adjusted depending on the size of the surface to be irradiated, and is, for example, 35° to 45° in the present embodiment. Hereinafter, the control of the alignment of light by light flux controlling member 100 will be described with a first inclining surface 121 side relative to optical axis OA in FIG. 2 as a upward or above (positive) side, and a second inclining surface 132 side relative to optical axis OA in FIG. 2 as a downward or below (negative) side.

Light passing through any part of first control portion 120, namely first inclining surface 121, partial annular fresnel lens 122, inner groove wall 123 or partial annular protrusion 124 is emitted from light emitting device 200 toward a further position in Y-direction. The light emitted toward the further position forms a first peak above optical axis OA in the light distribution curve of light emitting device 200. Light passing through any part of second control portion 130, namely second inclining surface 132 or outer groove wall 131 is emitted directly downward from light emitting device 200 (in Z-direction). The light emitted directly downward from light emitting device 200 forms a second peak below optical axis OA in the light distribution curve of light emitting device 200.

As illustrated in FIG. 5B, angle θ1 is, for example, +11° and angle θ2 is, for example, −35° in light emitting device 200. The absolute value of angle θ1 is smaller than that of angle θ2, and the luminous intensity at angle θ1 (intensity of the first peak) is larger than the luminous intensity at angle θ2 (intensity of the second peak).

Figure 6A:
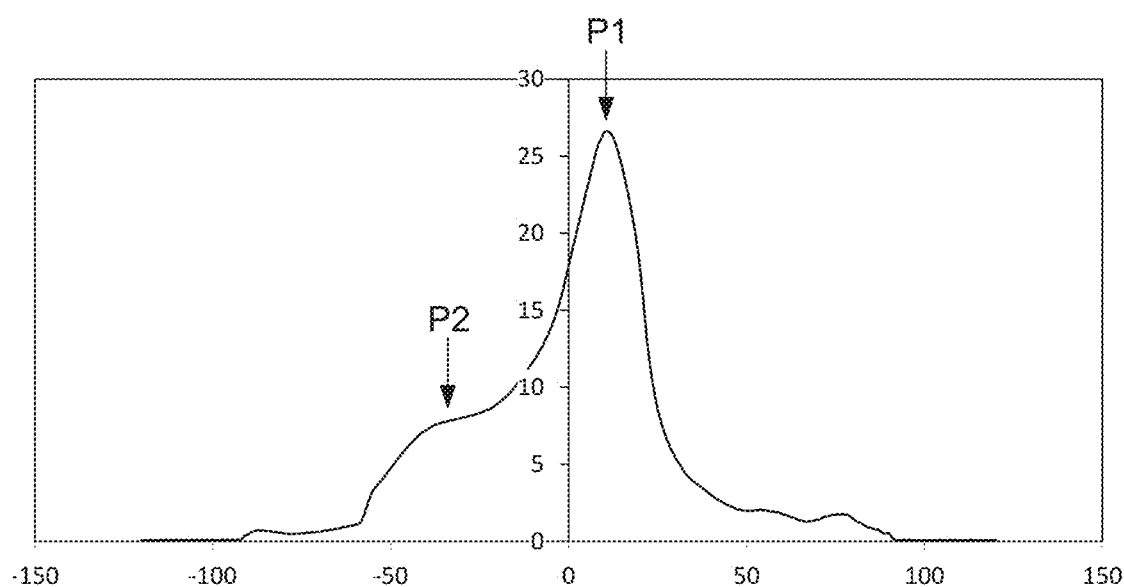
FIG. 6A is a graph showing an example of a luminous intensity (light distribution characteristics) in the emission direction of light emitted from the light emitting device.
Figure 6B:
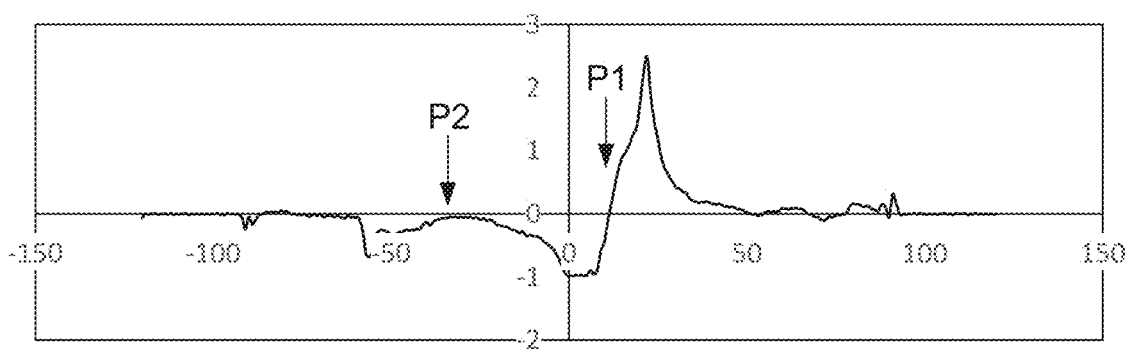
FIG. 6B is a graph showing the gradient of a curve that shows the light distribution characteristics in FIG. 6A.

The above-described "first peak" has the maximum luminous intensity in a portion where the luminous intensity of emitted light component changes from increase to decrease or vice versa. The first peak is indicated by arrow P1 in FIGS. 6A and 6B. FIG. 6A is a curve which shows light distribution characteristics of light emitting device 200 and which is drew by connecting luminous intensities plotted at respective angles on the abscissa. The slope of the tangent at the first peak becomes zero in the curve. The above-described "second peak" is positioned on the negative (−) side compared to the first side and at the closest position to the first peak. The slope of the curve showing the light distribution characteristics (luminous intensity) changes from increase to decrease at the second peak. The second peak is indicated by arrow P2 in FIGS. 6A and 6B.

Light flux controlling member 100 thus controls the orientation of the most of the flux of light emitted from light emitting element 210 toward a position slightly further than a position where light flux along optical axis OA of light emitting element 210 reaches, as well as the orientation of another part of the light flux toward a position directly under light emitting device 200. For example, in FIG. 1A, the direction of the light emitted toward the further position is represented by an arrow at an angle of +θ1 relative to optical axis OA, and the direction of the light emitted toward the directly under position is represented by an arrow at an angle of −θ2 relative to optical axis OA. In general, absolute value of angle θ2 is smaller than that of angle θ3 between optical axis OA and line segment OP where P is the edge of surface to be irradiated 310 (the intersection of surface to be irradiated 310 and the frame supporting light emitting device 200) and O is the center of the light emitting surface of light emitting element 210. Therefore, when a region above optical axis OA is set to be the positive side and a region below optical axis OA (surface to be irradiated 310 side) is set to be the negative side, formulas θ1>0°, θ2<0°, and |θ1|<|θ2|<|θ3| are satisfied in illumination apparatus 300.

In illumination apparatus 300 of the present embodiment, the number of arranged light emitting devices 200 in X-direction is set to be 5, distance Dx (center-to-center distance) between light emitting devices 200 in X-direction is set to be 21 mm, and distance Dy between light emitting devices 200 facing each other in Y-direction is set to be 410 mm Distance Dy is the same as distance D1 in FIG. 1A. In this instance, distance D2 in FIG. 1A is, for example, 450 mm. The reference of the position of light emitting device 200 is the center of the light emitting surface of light emitting element 210. FIGS. 7A to 7C and 8A to 8C show examples of illuminance distributions in Y-direction with different distances (heights) Dz from light emitting device 200 to surface to be irradiated 310 in Z-direction in the above-described illumination apparatus 300.

Figure 7A:
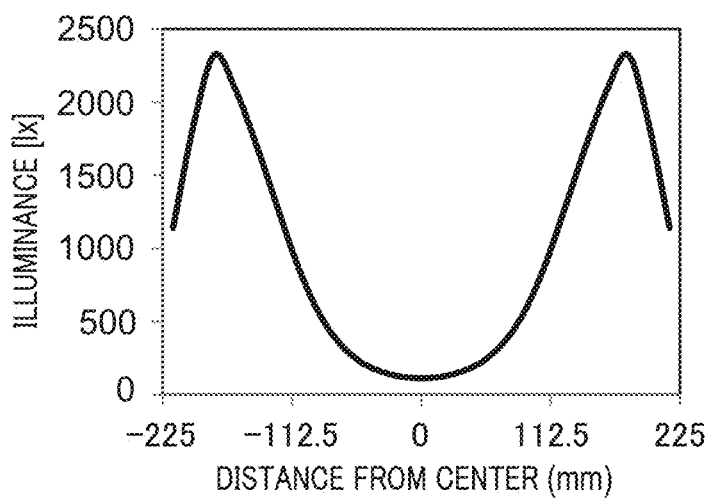
FIG. 7A shows the illuminance distribution of a surface to be irradiated in Y-direction with distance Dz of 50 mm from the light emitting device to the surface to be irradiated.
Figure 7B:
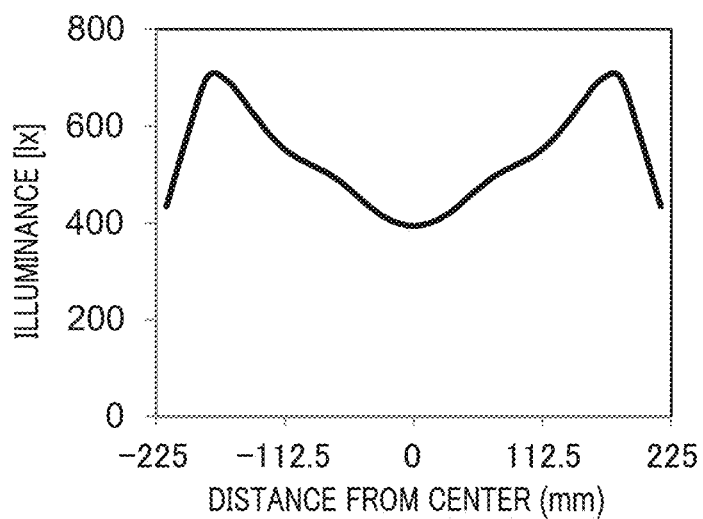
FIG. 7B shows the illuminance distribution with the distance Dz of 100 mm.
Figure 7C:
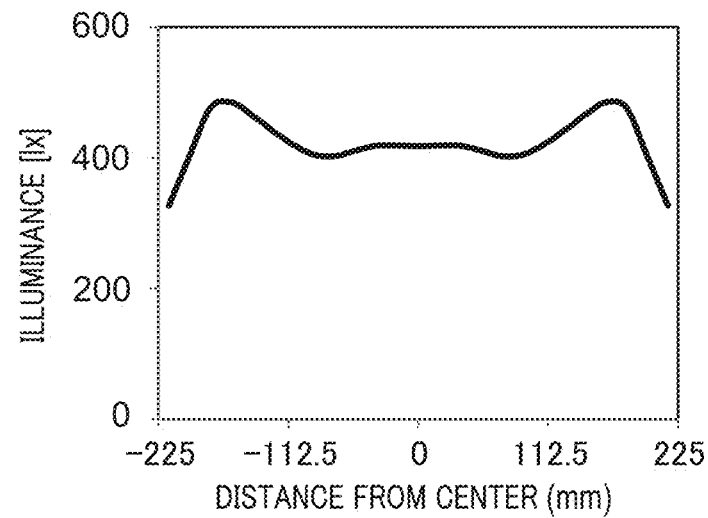
FIG. 7C shows the illuminance distribution with the distance Dz of 125 mm.
Figure 8A:
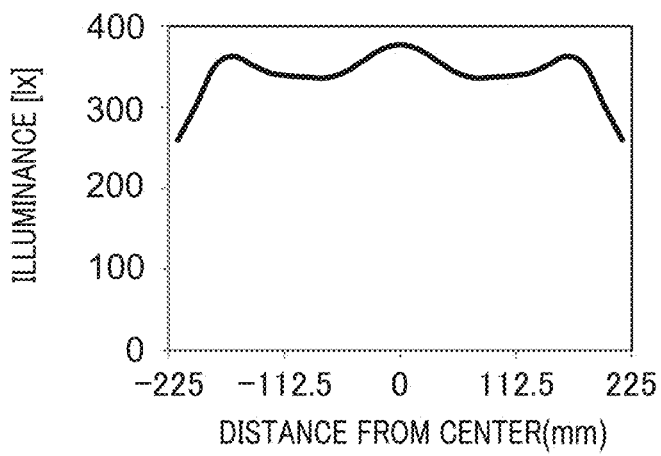
FIG. 8A shows the illuminance distribution with the distance Dz of 150 mm.
Figure 8B:
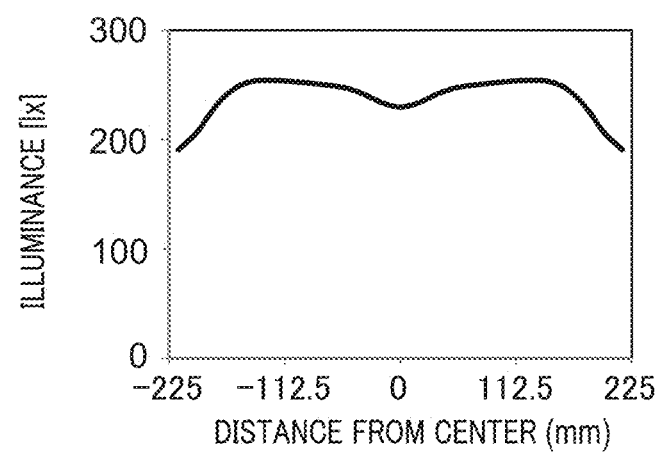
FIG. 8B shows the illuminance distribution with the distance Dz of 200 mm.
Figure 8C:
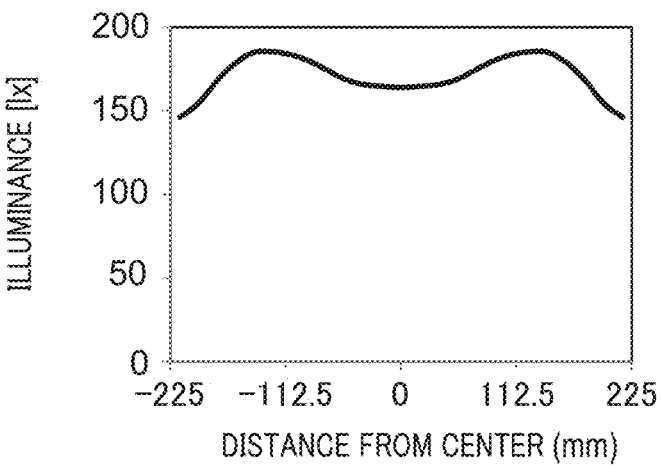
FIG. 8C shows the illuminance distribution with the distance Dz of 250 mm.

FIG. 7A shows the illuminance distribution of surface to be irradiated 310 in Y-direction with the distance Dz of 50 mm from light emitting device 200 to surface to be irradiated 310. FIG. 7B shows the illuminance distribution with the distance Dz of 100 mm, and FIG. 7C shows the illuminance distribution with the distance Dz of 125 mm FIG. 8A shows the illuminance distribution with the distance Dz of 150 mm, FIG. 8B shows the illuminance distribution with the distance Dz of 200 mm, and FIG. 8C shows the illuminance distribution with the distance Dz of 250 mm.

Table 1 shows the uniformity of the illuminance distributions of surface to be irradiated 310 in Y-direction with different distances Dz from light emitting device 200 to surface to be irradiated 310, in the above-described illumination apparatus 300. The uniformity is a value obtained by dividing the minimum illuminance in each illuminance distribution by the average illuminance. The closer to one the uniformity is, the more uniform the illuminance distribution is. From FIGS. 7A to 8C and Table 1 below, the illuminance distributions with the distances Dz from 125 to 250 mm have the uniformity of 0.75 or more, and thus have satisfactorily uniform distributions.

TABLE 1

| Dx (mm) | Dy (mm) | Dz (mm) | Uniformity (—) |
| --- | --- | --- | --- |
| 21 | 410 | 50 | 0.11 |
| 21 | 410 | 100 | 0.73 |
| 21 | 410 | 125 | 0.77 |
| 21 | 410 | 150 | 0.76 |
| 21 | 410 | 200 | 0.80 |
| 21 | 410 | 250 | 0.85 |

Figure 9A:
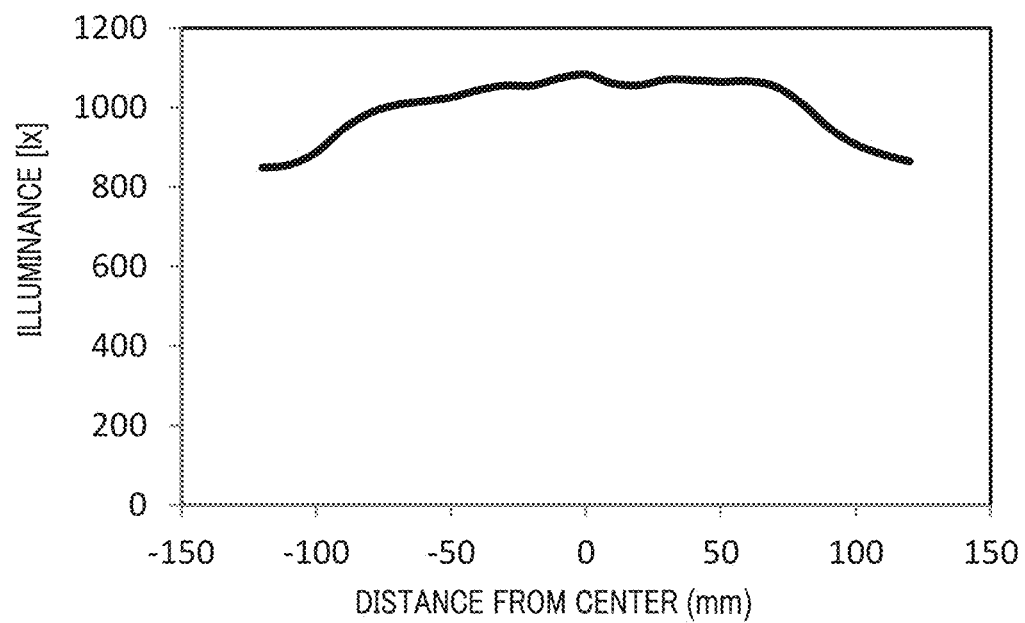
FIG. 9A shows the illuminance distribution of the surface to be irradiated in Y-direction when distance Dy in Y-direction between the light emitting devices in the illumination apparatus is 250 mm.
Figure 9B:
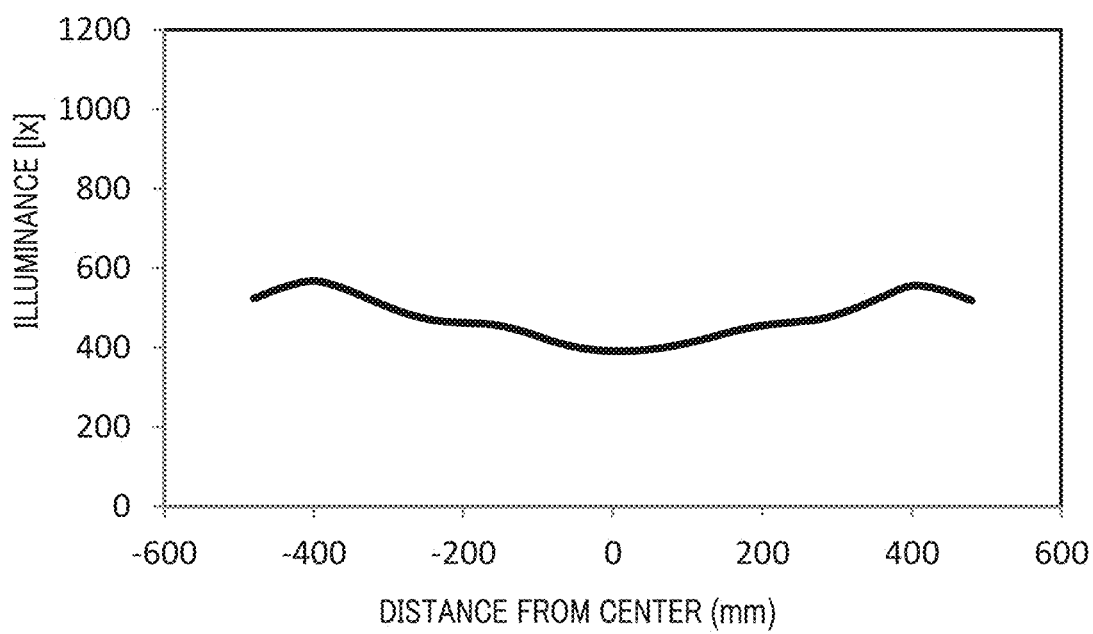
FIG. 9B shows the illuminance distribution of the surface to be irradiated in Y-direction when the distance Dy is 1,000 mm.

Table 2 below shows the uniformity of the illuminance distributions of surface to be irradiated 310 in Y-direction with different distances Dy between light emitting devices 200 in Y-direction in illumination apparatus 300. FIG. 9A shows the illuminance distribution of surface to be irradiated 310 in Y-direction when the distance Dy is 250 mm, and FIG. 9B shows the illuminance distribution of surface to be irradiated 310 in Y-direction when the distance Dy is 1,000 mm. In the above-described illumination apparatus 300, distance Dx is 21 mm and distance Dz is 250 mm.

TABLE 2

| Dx (mm) | Dy (mm) | Dz (mm) | Uniformity (—) |
| --- | --- | --- | --- |
| 21 | 250 | 250 | 0.85 |
| 21 | 350 | 250 | 0.88 |
| 21 | 450 | 250 | 0.84 |
| 21 | 500 | 250 | 0.82 |
| 21 | 700 | 250 | 0.85 |
| 21 | 800 | 250 | 0.91 |
| 21 | 900 | 250 | 0.93 |
| 21 | 1000 | 250 | 0.82 |
| 21 | 1050 | 250 | 0.76 |

In the above-described illumination apparatus 300, satisfactorily uniform illuminance distribution having the uniformity of 0.75 or more can be achieved with every tested distance Dy. In particular, more uniform illuminance distribution having the uniformity of 0.80 or more can be achieved when the distance Dy is in a range of 2 to 8 times the distance Dz in illumination apparatus 300.

Figure 10A:
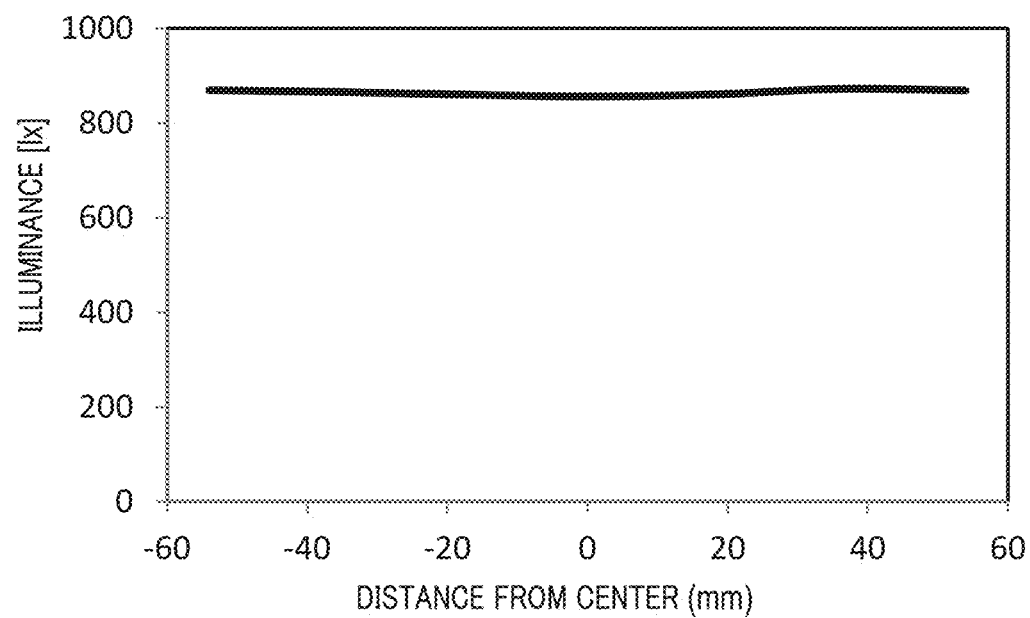
FIG. 10A shows the illuminance distribution of the surface to be irradiated in X-direction when distance Dx in X-direction between the light emitting devices in the illumination apparatus is 21 mm.
Figure 10B:
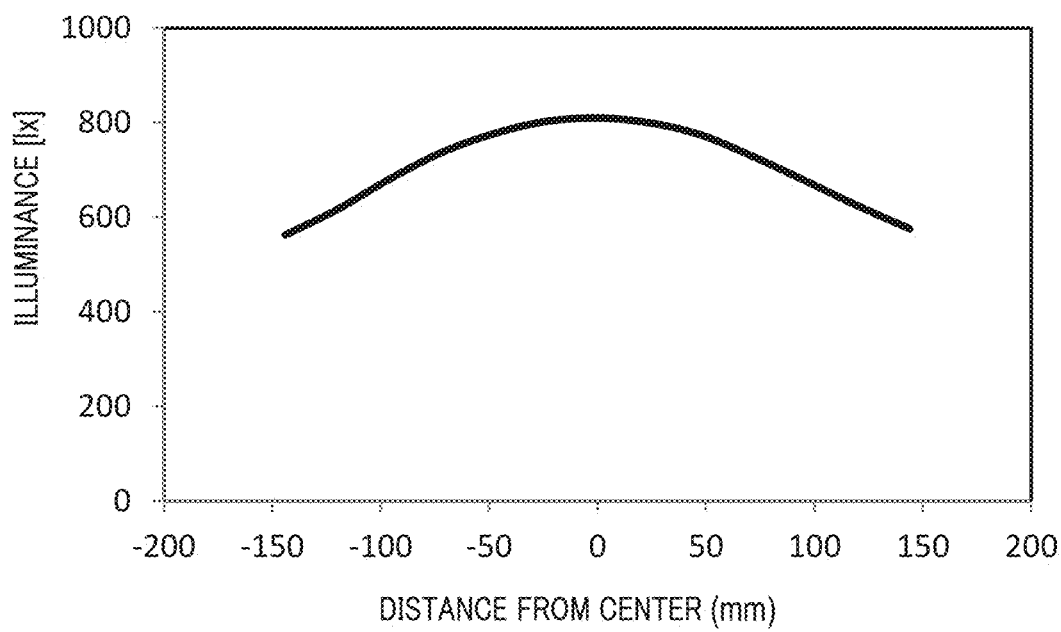
FIG. 10B shows the illuminance distribution of the surface to be irradiated in X-direction when the distance Dx is 60 mm.

Table 3 below shows the uniformity of the illuminance distributions of surface to be irradiated 310 in X-direction with different distances Dx between light emitting devices 200 in X-direction in illumination apparatus 300. FIG. 10A shows the illuminance distribution of surface to be irradiated 310 in X-direction when the distance Dx is 21 mm, and FIG. 10B shows the illuminance distribution of surface to be irradiated 310 in X-direction when the distance Dx is 60 mm. In the above-described illumination apparatus, distance Dy is 410 mm and distance Dz is 250 mm. The above-described illuminance distribution is measured in X-direction at the center (position with the distance of 205 mm from light emitting device 200 in Y-direction) of the distance Dy.

TABLE 3

| Dx (mm) | Dy (mm) | Dz (mm) | Uniformity (—) |
|---|---|---|---|
| 21 | 410 | 250 | 0.99 |
| 30 | 410 | 250 | 0.96 |
| 40 | 410 | 250 | 0.90 |
| 50 | 410 | 250 | 0.85 |
| 60 | 410 | 250 | 0.80 |
| 70 | 410 | 250 | 0.77 |
| 80 | 410 | 250 | 0.74 |

In the above-described illumination apparatus 300, satisfactorily uniform illuminance distribution having the uniformity of 0.75 or more can be achieved with distance Dx of 70 mm or less. In particular, more uniform illuminance distribution having the uniformity of 0.80 or more can be achieved with the distance Dx of 60 mm or less in illumination apparatus 300.

Figure 11A:
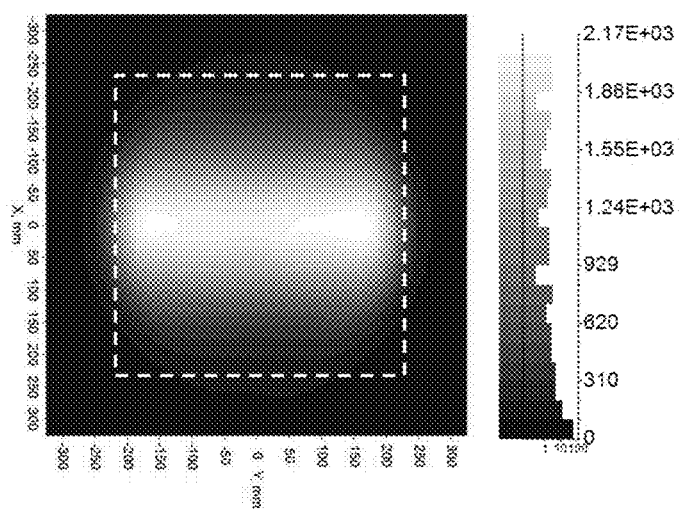
FIG. 11A shows the illuminance distribution, in XY-directions, of the surface to be irradiated illuminated by a pair of the light emitting devices that is installed at angle θa of 40° between the optical axis of the light emitting device and the surface to be irradiated.
Figure 11B:
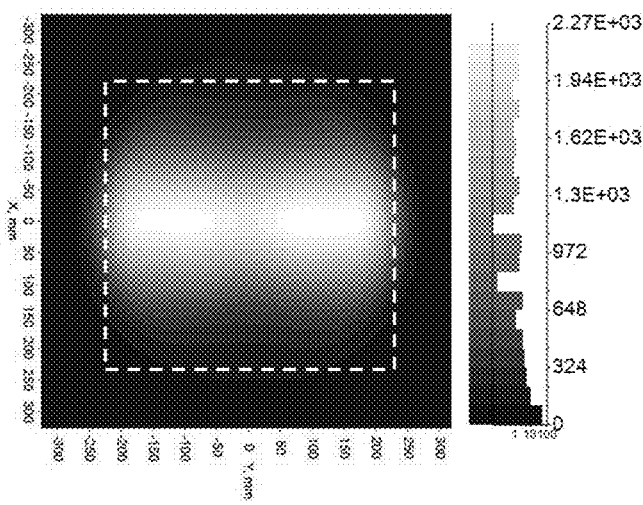
FIG. 11B shows the illuminance distribution, in XY-directions, of the surface to be irradiated illuminated by the pair of the light emitting devices that is installed at the angle θa of 45°.
Figure 11C:
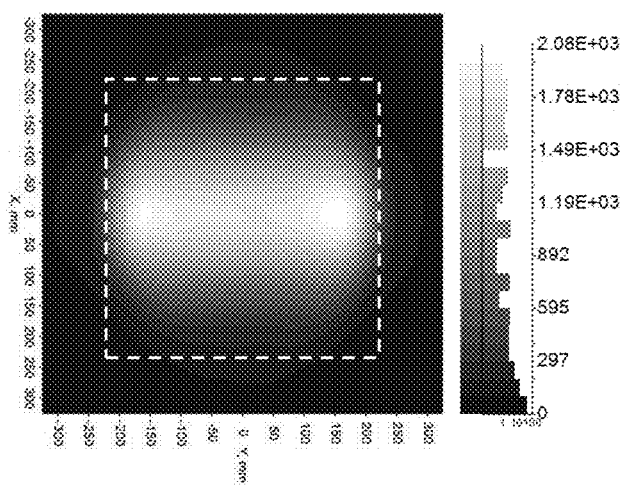
FIG. 11C shows the illuminance distribution, in XY-directions, of the surface to be irradiated illuminated by the pair of the light emitting devices that is installed at the angle θa of 35°.

FIGS. 11A to 11C show the illuminance distributions, in XY-directions, of surface to be irradiated 310 illuminated by a pair of light emitting devices 200 which face each other in Y-direction with different installation angles of the pair in illumination apparatus 300.

FIG. 11A shows the illuminance distribution, in XY-directions, of surface to be irradiated 310 illuminated by a pair of light emitting devices 200 that is installed at angle θa of 40° between optical axis OA of each light emitting device 200 and surface to be irradiated 310, FIG. 11B shows the illuminance distribution, in XY-directions, of surface to be irradiated 310 illuminated by the pair of light emitting devices 200 that is installed at the angle θa of 45°, and FIG. 11C shows the illuminance distribution, in XY-directions, of surface to be irradiated 310 illuminated by the pair of light emitting devices 200 that is installed at the angle θa of 35°. In the above-described illumination apparatus 300, distance Dy is 410 mm and distance Dz is 250 mm.

As obvious from FIGS. 11A to 11C, satisfactorily uniform illuminance distribution can be achieved when the angle θa is in a range of 35° to 45°, and more uniform illuminance distribution can be achieved when the angle θa is 40°.

Figure 12:
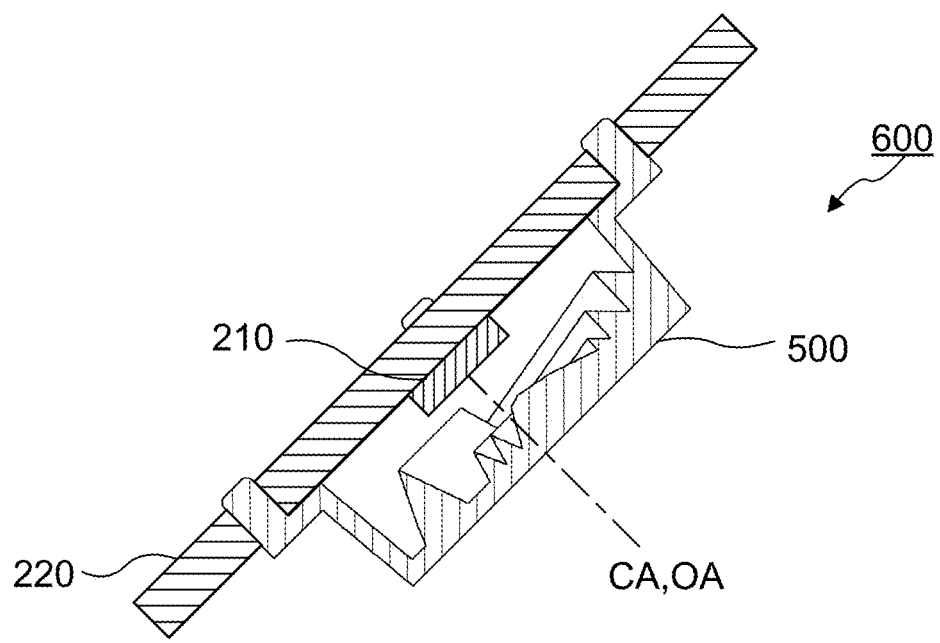
FIG. 12 is a cross-sectional view schematically illustrating a configuration example of a conventional light emitting device.
Figure 13A:
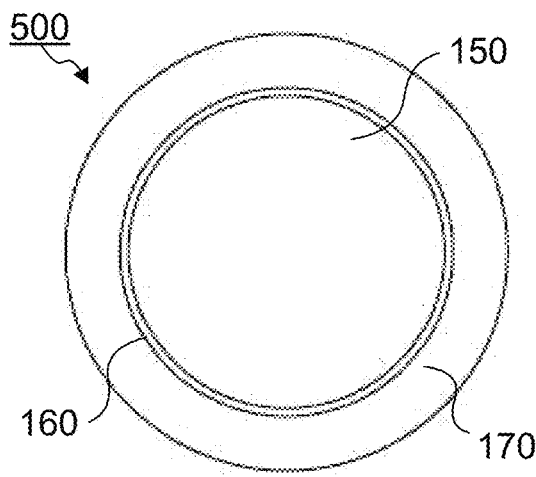
FIG. 13A is a plan view of an example of a conventional light flux controlling member.
Figure 13B:
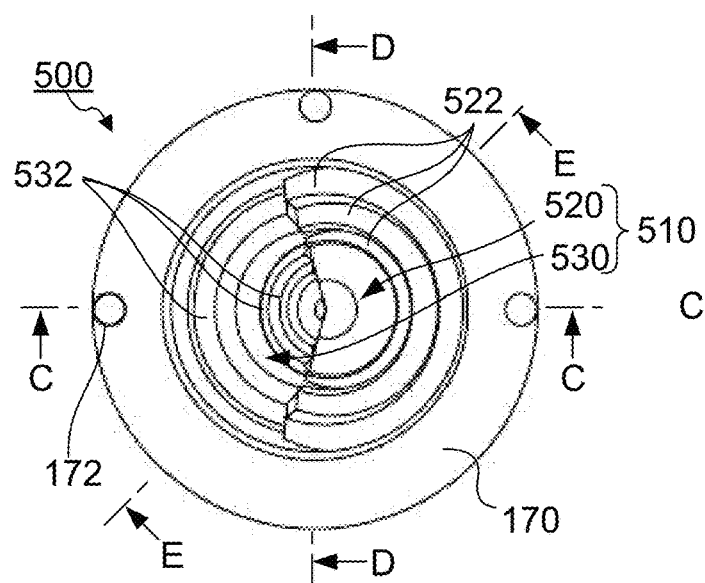
FIG. 13B is a bottom view of the example of the light flux controlling member.
Figure 13D:
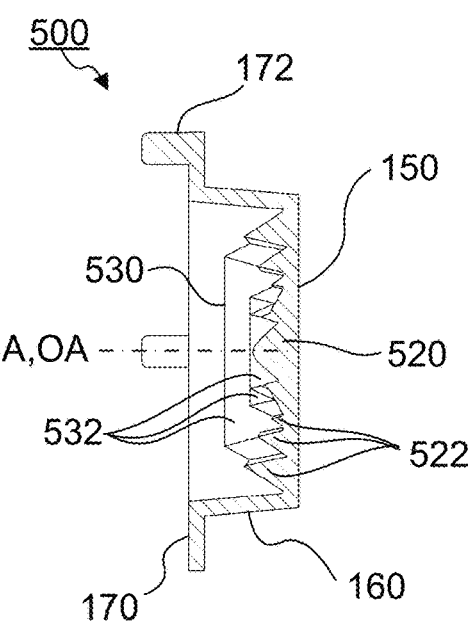
FIG. 13D illustrates a cross section of the example of the light flux controlling member taken along line D-D of FIG. 13B.
Figure 13C:
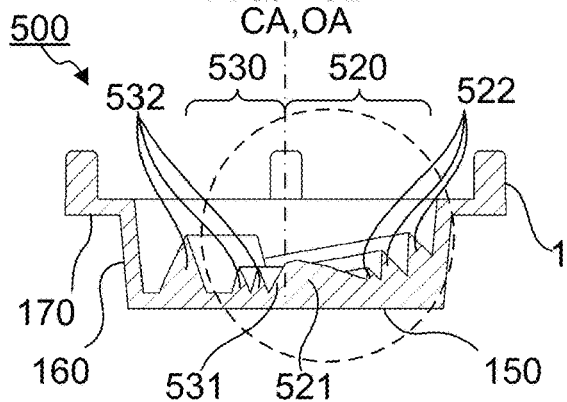
FIG. 13C illustrates a cross section of the example of the light flux controlling member taken along line C-C of FIG. 13B.
Figure 13E:
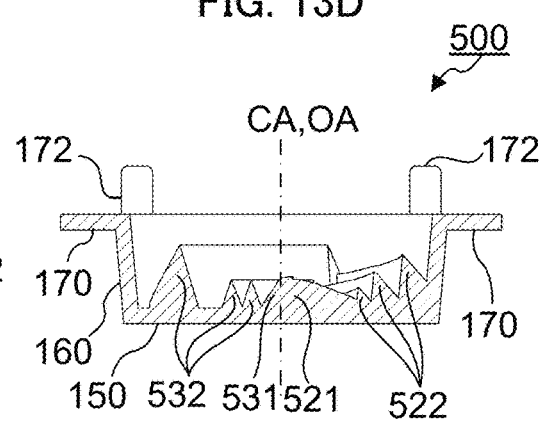
FIG. 13E illustrates a cross section of the example of the light flux controlling member taken along line E-E of FIG. 13B.

As a prior art for comparing with light emitting device 200, described below are a configuration example of a light emitting device described in PTL 1 and the illuminance distribution obtained by the light emitting device. FIG. 12 is a cross-sectional view schematically illustrating a configuration example of a light emitting device described in PTL 1. FIG. 13A is a plan view of an example of a light flux controlling member described in PTL 1, FIG. 13B is a bottom view of the example of the light flux controlling member, FIG. 13C illustrates a cross section of the example of the light flux controlling member taken along line C-C of FIG. 13B, FIG. 13D illustrates a cross section of the example of the light flux controlling member taken along line D-D of FIG. 13B, and FIG. 13E illustrates a cross section of the example of the light flux controlling member taken along line E-E of FIG. 13B. Line E-E intersects line C-C or D-D at an angle of 45°.

As illustrated in FIG. 12, light emitting device 600 has a configuration the same as the above-described light emitting device 200 except for including light flux controlling member 500 in place of light flux controlling member 100. As illustrated in FIGS. 13A to 13E, light flux controlling member 500 has a configuration the same as the above-described light flux controlling member 100 except for including incidence region 510 in place of incidence region 110.

Incidence region 510 includes first lens region 520 and second lens region 530. Each of first lens region 520 and second lens region 530 has a shape of a fan with central axis CA of light flux controlling member 500 as its center in plan view. The central angle of the fan of first lens region 520 is, for example, 220°, and the central angle of the fan of second lens region 530 is, for example, 140°.

First lens region 520 includes first control portion 521 positioned on the center side of the fan, and a plurality of first protrusions 522 positioned on the outer rim side of the fan. First control portion 521 has a shape such that the above-described fan of second lens region 530 is cut out from a substantially cone shaped material in the vertical direction with the apex of the cone left intact. The central axis of the cone is tilted toward second lens region 530 by 10°. The apex of first control portion 521 is positioned in first control portion 521.

First protrusions 522 form a concave/convex pattern the same as the reflective fresnel lens portion that is tilted by 10°. Each first protrusion 522 has an arc shape in plan view. Each first protrusion 522 includes a first inclining surface inside the ridge line of first protrusion 522, and a second inclining surface outside the ridge line. This second inclining surface is configured as a total reflection surface.

Second lens region 530 includes second control portion 531 positioned on the center side of the fan, and a plurality of second protrusions 532 positioned on the outer rim side of the fan. Second control portion 531 has a shape such that the fan of first lens region 520 is cut out from a cone along the central axis of the cone from the apex of the cone. The central axis of the cone coincides with central axis CA.

Each second protrusion 532 has an arc shape in plan view with central axis CA as its curvature center. Each second protrusion 532 includes a third inclining surface inside the ridge line of second protrusion 532, and a fourth inclining surface outside the ridge line. This fourth inclining surface is configured as a total reflection surface.

Figure 14A:
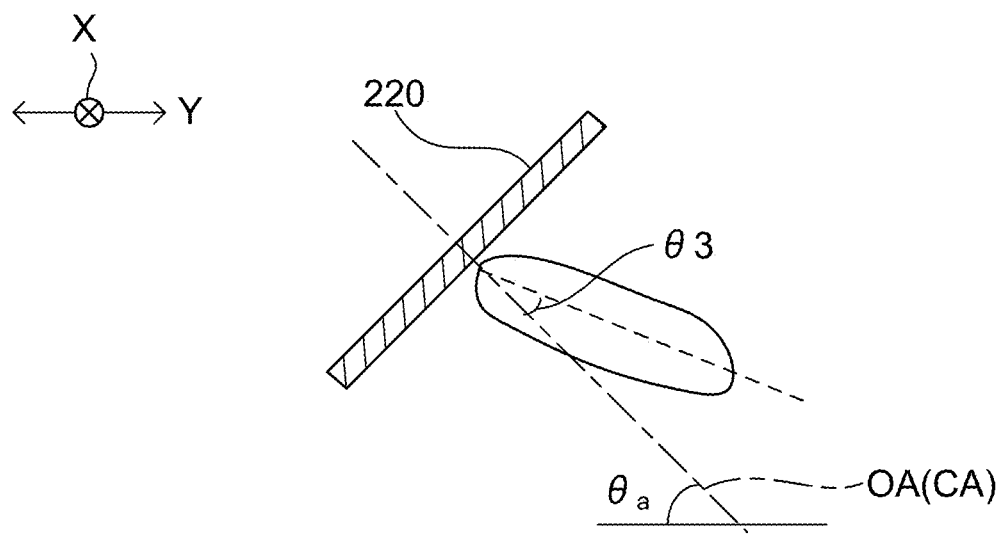
FIG. 14A is a graph showing an example of a light distribution curve of light emitted from the conventional light emitting device.

In light emitting device 600, light emitted from light emitting element 210 is incident on incidence region 510 and emitted from emission region 150 in a predetermined direction after the alignment of the light is controlled. Light incident on first control portion 521 or second control portion 531 is emitted upward from emission region 150. Light incident on the first inclining surface of first protrusion 522 is totally reflected by the second inclining surface thereof, and emitted upward from emission region 150. Light incident on the third inclining surface of second protrusion 532 is totally reflected by the fourth inclining surface thereof, and emitted upward from emission region 150. Alignment of any light incident on incidence region 510 of light flux controlling member 500 is thus controlled so that the light is emitted upward from emission region 150. The light distribution curve of light emitted from light flux controlling member 500 has a peak corresponding to the above-described first peak, but does not have a peak corresponding to the above-described second peak. As illustrated in FIG. 14A, angle θ3 between optical axis OA and a straight line that connects the peak in the light distribution curve of light flux controlling member 500 and the starting point of optical axis OA is for example 21°.

Figure 14B:
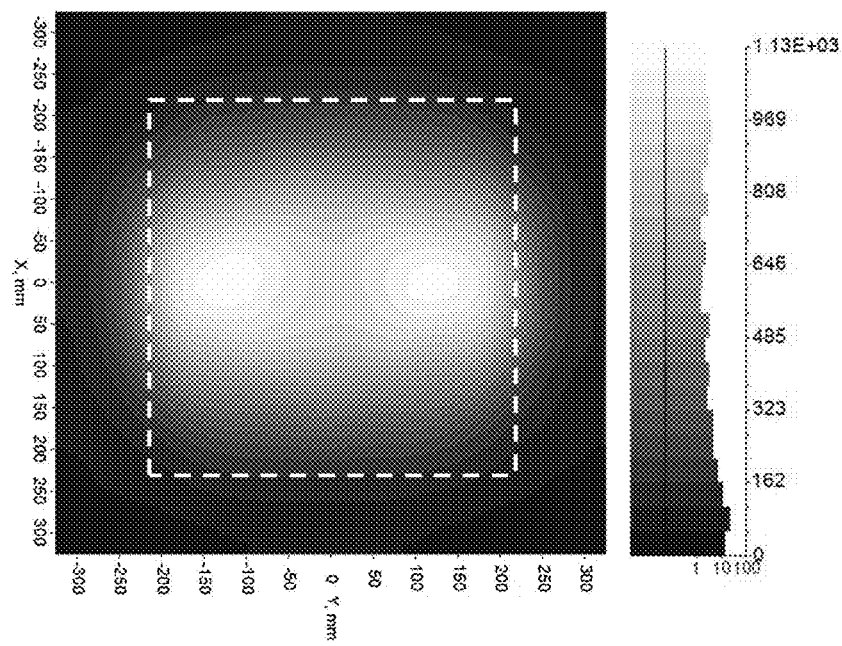
FIG. 14B shows illuminance distribution, in XY-directions, of a surface to be irradiated illuminated by a pair of the conventional light emitting devices that is installed at angle θa of 45° between the optical axis of the conventional light emitting device and the surface to be irradiated.
Figure 15A:
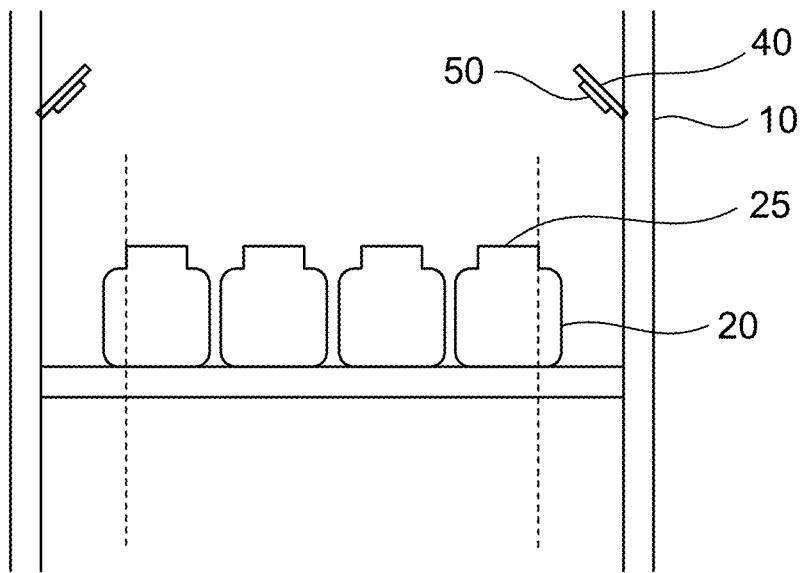
FIG. 15A is a front view schematically illustrating a configuration example of a conventional illumination apparatus.
Figure 15B:
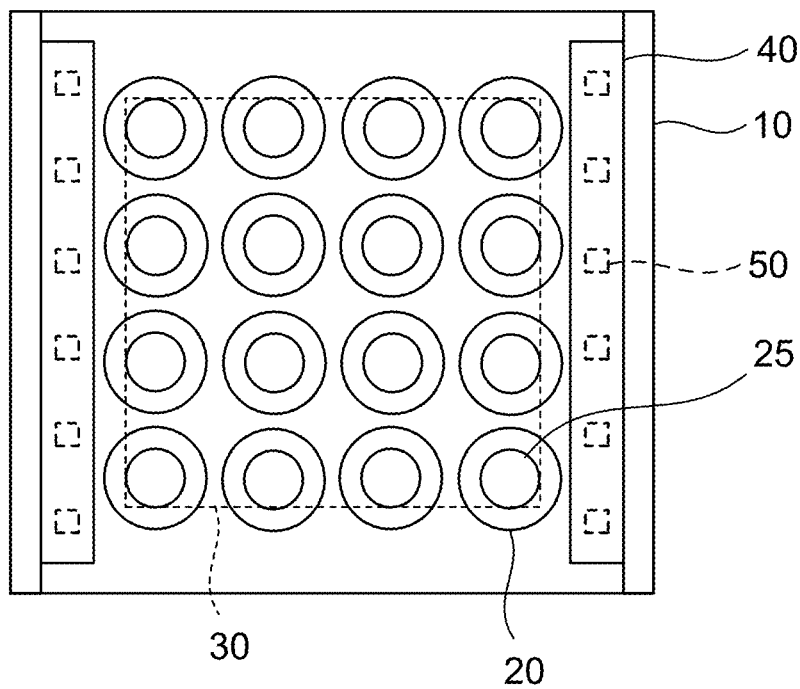
FIG. 15B is a plan view schematically illustrating the configuration example of the conventional illumination apparatus.

FIG. 14B shows the illuminance distribution, in XY-directions, of surface to be irradiated 310 illuminated by a pair of light emitting devices 600 that is installed at angle θa of 45° between optical axis OA of each light emitting device 600 and surface to be irradiated 310. The pair of light emitting devices 600 is each disposed at a position inside the outer edge (broken line in FIG. 14B) of surface to be irradiated 310 by 20 mm in Y-direction: the same as that of light emitting device 200.

As with light emitting device 200, light emitting device 600 emits light toward a further position, and also to the ends of surface to be irradiated 310 in Y-direction. However, the illuminance on surface to be irradiated 310 illuminated by light emitting devices 600 is clearly low compared to light emitting devices 200. The continuation of high illuminance in surface to be irradiated 310 illuminated by light emitting devices 600 is broken at the center of surface to be irradiated 310 in Y-direction, and thus the uniformity is lower in the case of light emitting device 600 than that of light emitting device 200.

As compared to light flux controlling member 500 of light emitting device 600, light flux controlling member 100 of light emitting device 200 according to the present embodiment controls part of relatively strong light in the vicinity of optical axis OA of light emitting element 210 to be aligned toward both further and closer positions, and controls the rest of the light emitted from light emitting element 210 to be aligned toward a further position. Light emitting device 200 including light flux controlling member 100 is thus capable of illuminating both further and directly under positions in an appropriate balance. Accordingly, light emitting device 200 is capable of satisfactorily and uniformly illuminating surface to be irradiated 310 from the end to a further position in Y-direction, even when light emitting device 200 is disposed directly upward from surface to be irradiated 310.

Light flux controlling member 100 in the present embodiment may include further components within a range where light flux controlling member 100 has the above-described optical characteristics.

For example, in light flux controlling member 100, the wall in incidence region 110 and the wall of tube portion 160 are both preferably tilted at an angle larger than 0° relative to optical axis OA for preventing the removal of a product out of a mold from becoming difficult by the formation of an undercut portion.

The inclination angles of inner peripheral walls 122a in partial annular fresnel lens 122 may be the same or different. The inclination angles of outer peripheral walls 122b may also be the same or different.

Adjacent surfaces (for example, inner peripheral wall 122a and outer peripheral wall 122b) in incidence region 110 may be connected with each other via another surface, such as a curved surface. Formation of another surface is suitable for facilitating the production of light flux controlling member 100 by injection molding.

A generating line of a surface in incidence region 110 (line along the inclination direction of the surface) may be a straight line or a curved line.

First inclining surface 121 and second inclining surface 132 are not necessarily be in a shape of a semicircle in plan view. For example, second inclining surface 132 may be a fan with its central angle smaller than that of first inclining surface 121. First inclining surface 121 and second inclining surface 132 both having a shape of a semicircle in plan view however enables facilitating of mold production, and is suitable for facilitating the confirmation of the orientation of light flux controlling member 100.

First inclining surface 121 and second inclining surface 132 are not necessarily be in a shape of a fan in plan view with central axis CA as the center thereof. For example, the shape in plan view may be a shape of a polygon extending from central axis CA like a fan, or a shape that extends beyond central axis CA (i.e., central axis CA is positioned within the shape in plan view).

In addition, incidence region 110 may include other control portions in addition to first control portion 120 and second control portion 130.

The above-described control portions are not necessarily be formed from a inclining surface as long as a desired function can be achieved. For example, first inclining surface 121 may be composed of a fresnel lens portion.

Further, emission region 150 may be a smooth surface or a roughened surface. Emission region 150 being roughened is suitable for reducing uneven illuminance of surface to be irradiated 310 without substantially disturbing light distribution controlled by incidence region 110. Surface roughness of emission region 150 can be defined with ten-point average roughness $Rz_{JIS}$, arithmetic average roughness Ra, maximum height roughness Rz, or the like (which are all roughness parameters defined by JIS B0601:2013). For example, the ten-point average roughness $Rz_{JIS}$ of emission region 150 is preferably 3 μm or less for suppressing uneven illuminance and for precise controlling of light distribution, and is preferably 1 μm or more for obtaining a suitable diffusion effect of emitted light.

From the forgoing, the following can be clearly understood. "Light flux controlling member 100 includes incidence region 110 for allowing incidence of light emitted from light emitting element 210 when incidence region 110 is disposed to face light emitting element 210, and emission region 150, located on a side opposite to light emitting element 210 relative to incidence region 110 therebetween, for emitting the light incident on incidence region 110. Incidence region 110 includes first control portion 120 which is located at least in one of two regions on a cross section of light flux controlling member 100 on a first side relative to central axis CA (the two regions are obtained by dividing the cross section by central axis CA, and the cross section includes central axis CA which is an axis to coincide with optical axis OA of light emitting element 210 and serve as an optical reference of light flux controlling member 100) and which is configured to control the light emitted from light emitting element 210 and incident on incidence region 110 in such a way that the light is emitted from emission region 150 in a direction tilted toward the first side; and second control portion 130 which is located at least in the other one of the two regions on the cross section on a second side relative to central axis CA and which is configured to control the light emitted from light emitting element 210 and incident on incidence region 110 in such a way that the light is emitted from emission region 150 in a direction tilted toward the second side. Second control portion 130 includes a refraction incidence surface that allows the light emitted from light emitting element 210 to be refracted and incident on light flux controlling member 100 in such a way that an angle of the light relative to central axis CA becomes smaller. A light distribution curve indicating luminous intensities on the cross section for emission directions of the light emitted from emission region 150 includes a first peak formed by light passing through first control portion 120 and emitted from emission region 150, and a second peak formed by light passing through second control portion 130 and emitted from emission region 150. The absolute value of angle θ1 of the first peak relative to central axis CA is smaller than that of angle θ2 of the second peak relative to central axis CA." Therefore, light flux controlling member 100 can uniformly illuminate surface to be irradiated 310 from the vicinity of a light source to the further end from the light source when employed in illumination apparatus 300.

In addition, the following is preferable for simplifying the shape of incidence region 110. "Incidence region 110 has a shape of a circle in plan view with central axis CA as its center. Incidence region 110 includes first inclining surface 121 which has a shape extending from central axis CA to the outer edge of first inclining surface 121 in plan view, and in which the distance from light emitting element 210 in a direction along central axis CA increases as the distance from the outer edge of first inclining surface 121 decreases; reflective partial annular fresnel lens 122 which is located outside the outer edge of first inclining surface 121 in a radial direction; second inclining surface 132 which is located in a portion that does not include first inclining surface 121 or partial annular fresnel lens 122 in the incidence region in plan view, which has a shape extending from central axis CA to the outer edge of second inclining surface 132 in plan view, and in which the distance from light emitting element 210 in the direction along central axis CA increases as the distance from the outer edge of second inclining surface 132 decreases; and partial annular protrusion 124 which is located outside the outer edge of second inclining surface 132 in the radial direction, and which includes an inside peripheral wall and an outside peripheral wall. First control portion 120 includes first inclining surface 121, partial annular fresnel lens 122 and partial annular protrusion 124, and second control portion 130 includes second inclining surface 132."

The following is preferable for increasing the intensity of light emitted to a further position. "First inclining surface 121 includes inner inclining surface 121a which extends from central axis CA, and in which a distance from light emitting element 210 has a smaller increasing rate; and outer inclining surface 121b which is connected with the outside of inner inclining surface 121a, and in which a distance from light emitting element 210 has a larger increasing rate."

For simplifying the shape and design of incidence region 110 and improving efficiency of installation operation of light flux controlling member 100 relative to light emitting element 210, the shape of first inclining surface 121 in plan view is preferably that of a semicircle.

As light emitting device 200 includes light flux controlling member 100 and light emitting element 210, light emitting device 200 can uniformly illuminate surface to be irradiated 310 from the vicinity of a light source to the further end from the light source when employed in illumination apparatus 300.

As illumination apparatus 300 includes planar surface to be irradiated 310; and light emitting device 200 disposed directly upward from surface to be irradiated 310 in such a way that optical axis OA obliquely intersects surface to be irradiated 310, and second control portion 130 is positioned closer to surface to be irradiated 310 than first control portion 120 is, illumination apparatus 300 capable of uniformly illuminating surface to be irradiated 310 from the vicinity of a light source to the further end from the light source can be provided.

This application claims priority based on Japanese Patent Application No. 2016-154891, filed on Aug. 5, 2016, the entire contents of which including the specification and the drawings are incorporated herein by reference.

INDUSTRIAL APPLICABILITY

A light flux controlling member, a light emitting device and an illumination apparatus according to the present invention can uniformly and efficiently radiate light emitted from a light emitting element on a planar surface to be irradiated. The light emitting device and the illumination apparatus according to the present invention are useful for applications which require uniform illumination of light in an oblique direction to a surface to be irradiated, such as illumination for plant cultivation, task lights (desk lamps) and reading lights.

REFERENCE SIGNS LIST

10 Cultivation shelf
20 Cultivation case
25 Opening
30, 310 Surface to be irradiated
40, 220 substrate
50, 200, 600 Light emitting device
100, 500 Light flux controlling member
110, 510 Incidence region
120, 521 First control portion
121 First inclining surface
121a Inner inclining surface
121b Outer inclining surface
122 Partial annular fresnel lens
122a Inner peripheral wall
122b Outer peripheral wall
123 Inner groove wall
124 Partial annular protrusion
124a Inside peripheral wall
124b Outside peripheral wall
130, 531 Second control portion
131 Outer groove wall
132 Second inclining surface
150 Emission region
160 Tube portion
170 Flange
172 Boss
210 Light emitting element
300 Illumination apparatus
520 First lens region
522 First protrusion
530 Second lens region
532 Second protrusion
CA Central axis
OA Optical axis

What is claimed is:

1. A light flux controlling member configured to control light distribution of light emitted from a light emitting element, the light flux controlling member comprising:
an incidence region for allowing incidence of the light emitted from the light emitting element when the incidence region is disposed to face the light emitting element; and
an emission region for emitting the light incident on the incidence region, the emission region being located on a side opposite to the light emitting element relative to the incidence region therebetween,
wherein the incidence region includes:
a first control portion which is located at least in one of two regions on a cross section of the light flux controlling member, the two regions being obtained by dividing the cross section by a reference axis included in the cross section, the reference axis being an axis to coincide with an optical axis of the light emitting element and to serve as an optical reference of the light flux controlling member, the one of the two regions being on a first side relative to the reference axis, the first control portion being configured to control the light emitted from the light emitting element and incident on the incidence region in such a way that the light is emitted from the emission region in a direction that is tilted to the first side relative to the reference axis, and a second control portion which is located at least in an other one of the two regions on the cross section, the other one of the two regions being on a second side relative to the reference axis, the second control portion being configured to control the light emitted from the light emitting element and incident on the incidence region in such a way that the light is emitted from the emission region in a direction that is tilted the second side relative to the reference axis, wherein the second control portion includes a refraction incidence surface that allows the light emitted from the light emitting element to be refracted and incident on the light flux controlling member in such a way that an angle of the light relative to the reference axis becomes smaller, wherein a light distribution curve indicating luminous intensities on the cross section for emission directions of the light emitted from the emission region includes a first peak formed by a first part of the light emitted from the emission region, the first part passing through the first control portion, and a second peak formed by a second part of the light emitted from the emission region, the second part passing through the second control portion, and wherein an absolute value of angle θ1 of the first peak relative to the reference axis is smaller than that of angle θ2 of the second peak relative to the reference axis.

2. The light flux controlling member according to claim 1, wherein:

the incidence region has a shape of a circle in plan view with the reference axis as a center thereof, and the incidence region further includes:
  a first inclining surface which has a shape extending from the center to an outer edge of the first inclining surface in plan view, wherein a distance from the light emitting element in a direction along the reference axis increases as a distance from the outer edge of the first inclining surface decreases;
  a reflective partial annular fresnel lens which is located outside the outer edge of the first inclining surface in a radial direction;
  a second inclining surface which is located in a portion that does not include the first inclining surface or the partial annular fresnel lens in the shape of the incidence region in plan view, the second inclining surface having a shape extending from the center to an outer edge of the second inclining surface in plan view, wherein a distance from the light emitting element in the direction along the reference axis increases as a distance from the outer edge of the second inclining surface decreases, and
  a partial annular protrusion which is located outside the outer edge of the second inclining surface in the radial direction, and the partial annular protrusion including an inside peripheral wall and an outside peripheral wall, wherein:
    the first control portion includes the first inclining surface, the partial annular fresnel lens and the partial annular protrusion, and
    the second control portion includes the second inclining surface.

3. The light flux controlling member according to claim 2, wherein the first inclining surface includes:
  an inner inclining surface extending from the center, wherein the distance from the light emitting element has a smaller increasing rate; and
  an outer inclining surface connected with an outside of the inner inclining surface, wherein the distance from the light emitting element has a larger increasing rate.

4. The light flux controlling member according to claim 2, wherein the first inclining surface has a shape of a semicircle in plan view.

5. A light emitting device comprising the light flux controlling member according to claim 1, and a light emitting element.

6. An illumination apparatus comprising:
  a planar surface to be irradiated; and
  the light emitting device according to claim 5, wherein the light emitting device is disposed directly upward from the surface to be irradiated in such a way that the optical axis obliquely intersects the surface to be irradiated, and the second control portion is positioned closer to the surface to be irradiated than the first control portion is.

* * * * *